(12) United States Patent
Yoshida et al.

(10) Patent No.: US 11,868,532 B2
(45) Date of Patent: Jan. 9, 2024

(54) SHAPE CHANGEABLE APPARATUS, SHAPE CONTROL METHOD, AND TACTILE SENSE PROVIDING APPARATUS

(71) Applicant: SONY GROUP CORPORATION, Tokyo (JP)

(72) Inventors: Kentaro Yoshida, Tokyo (JP); Masahiro Sato, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 13 days.

(21) Appl. No.: 17/597,353

(22) PCT Filed: Jul. 8, 2020

(86) PCT No.: PCT/JP2020/026648
§ 371 (c)(1),
(2) Date: Jan. 4, 2022

(87) PCT Pub. No.: WO2021/010241
PCT Pub. Date: Jan. 21, 2021

(65) Prior Publication Data
US 2022/0269348 A1 Aug. 25, 2022

(30) Foreign Application Priority Data
Jul. 18, 2019 (JP) .................... 2019-132925

(51) Int. Cl.
*G06F 3/041* (2006.01)
*G06F 3/01* (2006.01)
*H03K 17/968* (2006.01)

(52) U.S. Cl.
CPC ........... *G06F 3/016* (2013.01); *H03K 17/968* (2013.01); *G06F 2203/04102* (2013.01); *H03K 2217/96062* (2013.01)

(58) Field of Classification Search
None
See application file for complete search history.

(56) References Cited

U.S. PATENT DOCUMENTS

| 6,560,804 B2 | 5/2003 | Wise | |
| 2010/0253650 A1* | 10/2010 | Dietzel | G01L 1/247 |
| | | | 73/800 |

(Continued)

FOREIGN PATENT DOCUMENTS

| CN | 104428739 A | 3/2015 |
| CN | 107085478 A | 8/2017 |

(Continued)

OTHER PUBLICATIONS

International Search Report and Written Opinion of PCT Application No. PCT/JP2020/026648, dated Sep. 15, 2020, 10 pages of ISRWO.

*Primary Examiner* — Carl Adams
(74) *Attorney, Agent, or Firm* — CHIP LAW GROUP

(57) ABSTRACT

A shape changeable apparatus according to an embodiment of the present technology includes a space forming section, a fluid controller, a signal emitter, a detector, and a generator. The space forming section forms a space, and includes a deformable member that is arranged in contact with the space. The fluid controller is capable of deforming the member by controlling a flow of fluid with respect to the space. The signal emitter emits a signal into the space. The detector is arranged out of contact with the member within the space, and detects the emitted signal. The generator generates information regarding the deformation of the member on the basis of a result of the detection performed by the detector.

20 Claims, 19 Drawing Sheets

(56) References Cited

U.S. PATENT DOCUMENTS

| | | |
|---|---|---|
| 2011/0316776 A1 | 12/2011 | Ong et al. |
| 2012/0235935 A1* | 9/2012 | Ciesla ............... G06F 3/047 |
| | | 345/173 |
| 2012/0242607 A1 | 9/2012 | Ciesla |
| 2014/0160063 A1 | 6/2014 | Yairi et al. |
| 2017/0228089 A1 | 8/2017 | Hoggarth et al. |
| 2019/0091872 A1* | 3/2019 | Alspach ............ B25J 13/084 |

FOREIGN PATENT DOCUMENTS

| | | |
|---|---|---|
| DE | 102011077144 A | 12/2011 |
| GB | 2547032 A | 8/2017 |
| JP | 08-179878 A | 7/1996 |
| JP | 2009-151684 A | 7/2009 |
| JP | 2015-520455 A | 7/2015 |
| KR | 10-2015-0027088 A | 3/2015 |
| WO | 2013/173624 A2 | 11/2013 |

\* cited by examiner

SHAPE CHANGEABLE APPARATUS, SHAPE CONTROL METHOD, AND TACTILE SENSE PROVIDING APPARATUS

CROSS REFERENCE TO RELATED APPLICATIONS

This application is a U.S. National Phase of International Patent Application No. PCT/JP2020/026648 filed on Jul. 8, 2020, which claims priority benefit of Japanese Patent Application No. JP 2019-132925 filed in the Japan Patent Office on Jul. 18, 2019. Each of the above-referenced applications is hereby incorporated herein by reference in its entirety.

TECHNICAL FIELD

The present technology relates to a shape changeable apparatus that is applicable to, for example, a tactile sense providing apparatus or an input apparatus, a shape control method, and the tactile sense providing apparatus.

BACKGROUND ART

In the case of, for example, the touch-sensitive sheet member disclosed in Patent Literature 1, an aperture used for representing a sense of touch is formed in a sheet member. It is possible to provide a feeling of unevenness to a user using the air flowing out of or into the aperture (for example, paragraphs [0019] and [0020] of Patent Literature 1).

Further, Patent Literature 1 also discloses input devices such as a capacitive input device, a resistive input device, a surface-acoustic-wave (SAW) input device, an optical input device, and a multi-stage tact switch as devices that detect a position at which the finger of a user is slid, and an amount of pressing performed with the finger of the user (for example, paragraph [0110] of Patent Literature 1).

CITATION LIST

Patent Literature

Patent Literature 1: Japanese Patent Application Laid-open No. 2009-151684

DISCLOSURE OF INVENTION

Technical Problem

There is a need for a technology that enables the tactile sense providing apparatus described above to provide a tactile sense with a high degree of accuracy. Further, with respect to an input apparatus with which an operation and the like of a user can be input, there is a need for a technology that enables the input apparatus to detect an input operation with a high degree of accuracy.

In view of the circumstances described above, it is an object of the present technology to provide a shape changeable apparatus, a shape control method, and a tactile sense providing apparatus, the shape changeable apparatus making it possible to provide a tactile sense and detect an input operation with a high degree of accuracy.

Solution to Problem

In order to achieve the object described above, a shape changeable apparatus according to an embodiment of the present technology includes a space forming section, a fluid controller, a signal emitter, a detector, and a generator.

The space forming section forms a space, and includes a deformable member that is arranged in contact with the space.

The fluid controller is capable of deforming the member by controlling a flow of fluid with respect to the space.

The signal emitter emits a signal into the space.

The detector is arranged out of contact with the member within the space, and detects the emitted signal.

The generator generates information regarding the deformation of the member on the basis of a result of the detection performed by the detector.

In this shape changeable apparatus, the member can be deformed by controlling a flow of fluid with respect to the space. Further, information regarding the deformation of the member can be generated on the basis of a result of detection performed by the detector arranged out of contact with the member.

For example, the application of the shape changeable apparatus to a tactile sense providing apparatus makes it possible to provide a tactile sense with a high degree of accuracy by the fluid being controlled, on the basis of the information regarding the deformation of the member. Further, the application of the shape changeable apparatus to an input apparatus makes it possible to detect, with a high degree of accuracy, an operation or the like that is input to the member, on the basis of the information regarding the deformation of the member. Of course, an apparatus, a field, and the like to which the shape changeable apparatus can be applied are not limited.

The information regarding the deformation of the member may include at least one of information regarding a shape of the member, or information regarding a contact state of an object in contact with the member.

The member may be in the form of a film, and may include an inner surface situated on a side of the space, and an outer surface situated on a side of an external space, the inner surface being capable of reflecting the signal. In this case, the information regarding the deformation of the member may include at least one of information regarding a shape of the outer surface, or information regarding a contact state of an object in contact with the outer surface.

The signal emitter may be arranged within the space.

The fluid controller may control the flow of the fluid such that, due to the deformation of the member, a specified tactile sense is provided to a user in contact with the member.

The fluid controller may control the flow of the fluid on the basis of the information regarding the deformation of the member.

The fluid may be air.

The signal emitter may emit, as the signal, at least one of light, a radio wave, or sound. In this case, the detector may be capable of detecting at least one of the emitted light, the emitted radio wave, or the emitted sound.

The signal emitter may be capable of temporally changing an intensity of the signal.

The signal emitter may include at least one signal source that emits the signal. In this case, the detector may include at least one sensor that detects the emitted signal. Further, the generator may generate the information regarding the deformation of the member on the basis of a result of the detection performed by the at least one sensor.

The number of the at least one signal source may be larger than the number of the at least one sensor.

The number of the at least one signal source may be smaller than the number of the at least one sensor.

At least one of a condition in which the at least one signal source includes a plurality of the signal sources, or a condition in which the at least one sensor includes a plurality of the sensors may be satisfied. In this case, the at least one signal source and the at least one sensor may be arranged such that a distance between the signal source and the sensor is not constant.

The generator may generate the information regarding the deformation of the member according to a specified learning algorithm.

The signal emitter may be arranged to be capable of emitting the signal toward the member. In this case, the detector may be arranged to be capable of detecting the signal reflected off the member. Further, the shape changeable apparatus may further include a blocking portion that is arranged between the signal emitter and the detector.

The signal emitter may emit invisible light as the signal.

The signal emitter may emit light as the signal. In this case, the detector may be capable of detecting the emitted light. Further, the shape changeable apparatus may further include a filter portion that defines a wavelength of the light detected by the detector.

The tactile sense providing section may further include a tactile sense providing section that is capable of controlling at least one of a degree of hardness of the member or a temperature of the member on the basis of the information regarding the deformation of the member.

A shape control method according to an embodiment of the present technology includes deforming a deformable member by controlling a flow of fluid with respect to a space that is formed by a space forming section that includes the deformable member, the space being formed to be brought into contact with the member;

emitting a signal into the space;

detecting the signal by a detector that is arranged out of contact with the member within the space; and generating information regarding the deformation of the member on the basis of a result of the detection performed by the detector.

A tactile sense providing apparatus according to an embodiment of the present technology includes the space forming section, the fluid controller, the signal emitter, the detector, and the generator.

The fluid controller controls the flow of the fluid such that, due to the deformation of the member, a specified tactile sense is provided to a user in contact with the member.

MODE(S) FOR CARRYING OUT THE INVENTION

Embodiments according to the present technology will now be described below with reference to the drawings.

Figure 1A:
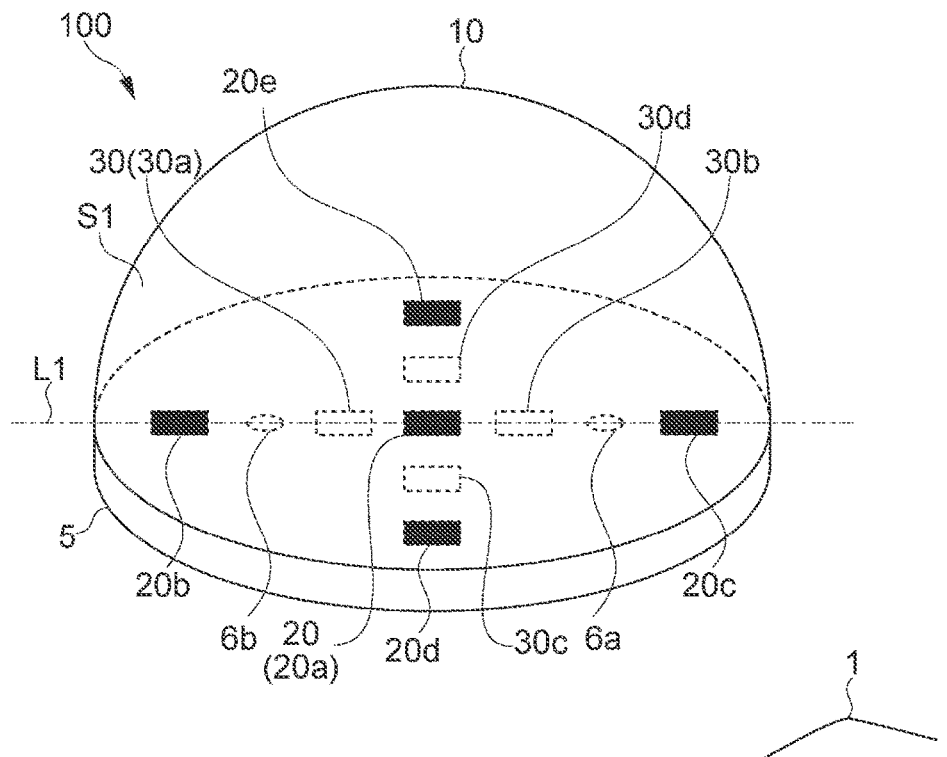
FIGS. 1A and 1B schematically illustrates an example of a configuration of a user interface apparatus according to an embodiment.
Figure 1B:
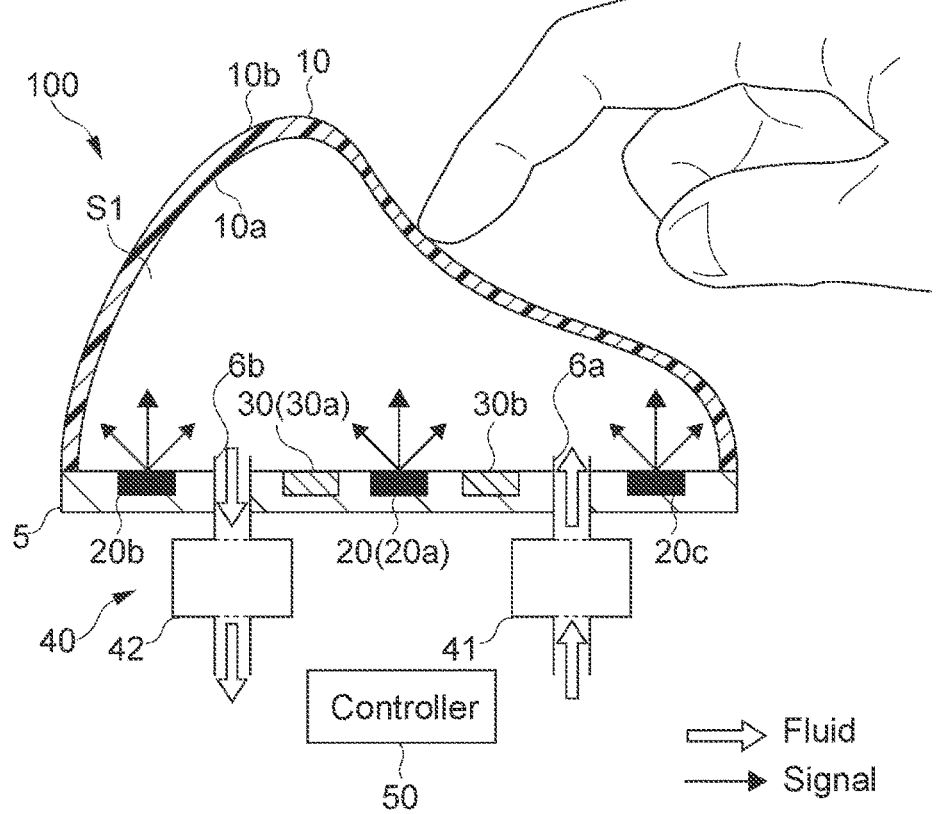

[Configuration of User Interface Apparatus] FIGS. 1A and 1B schematically illustrates an example of a configuration of a user interface apparatus according to an embodiment of the present technology (hereinafter referred to as a UI apparatus).

FIG. 1A is a perspective view of a UI apparatus 100, as viewed from diagonally above.

FIG. 1B is a cross-sectional view schematically illustrating a cross section of the UI apparatus 100. FIG. 1B illustrates a cross section when the UI apparatus 100 is cut straight down from the top of the UI apparatus 100 along a line L1 that passes through the center of the UI apparatus 100.

Further, FIG. 1B schematically illustrates a fluid control mechanism 40 and a controller 50 that are included in the UI apparatus 100.

The UI apparatus 100 serves as an input apparatus with which a user 1 can input various operations. Further, the UI apparatus 100 serves as a tactile sense providing apparatus that can provide a specified tactile sense to the user 1 in contact with the UI apparatus 100.

Note that the provision of a tactile sense may also be referred to as tactile-sense feedback. Thus, the UI apparatus 100 may also be referred to as a tactile-sense feedback apparatus.

The UI apparatus 100 corresponds to an embodiment of a shape changeable apparatus according to the present technology. In other words, this can also be said to be an example of applying the shape changeable apparatus according to the present technology to an input apparatus and a tactile sense providing apparatus. Of course, an apparatus, a field, and the like to which the shape changeable apparatus according to the present technology can be applied are not limited.

As illustrated in FIGS. 1A and 1B, the UI apparatus 100 includes a base 5, a deformation member 10, a plurality of signal sources 20, a plurality of sensors 30, the fluid control mechanism 40, and the controller 50.

The entirety of the base 5 has a circular-plate shape. The entirety of or a portion of the base 5 serves as a circuit board, and various circuits are arranged on the base 5.

The specific configuration of the base 5 such as a material is not limited, and the base 5 may be designed discretionarily.

The deformation member 10 is a deformable member. In the present disclosure, the term "deformation" includes any type of deformation such as elongation and contraction, bending, expansion, and shrinkage.

In the present embodiment, the deformation member 10 has a hemispherical outer shape, and is connected to a peripheral edge of the base 5.

As illustrated in FIG. 1B, the deformation member 10 is in the form of a film, and a space (hereinafter referred to as an internal space) S1 is formed on an inner side of the deformation member 10. In other words, the deformation member 10 is arranged in contact with the internal space S1.

A surface of the deformation member 10 on the side of the internal space S1 is an inner surface 10a, and a surface of the deformation member 10 on the side of an external space is an outer surface 10b. Note that the external space includes any space situated outside of the internal space S1.

The internal space S1 serves as a fluid holding space that can hold fluid. In the present embodiment, air is used as fluid. Accordingly, for example, the outside air can be used, and the UI apparatus 100 having a simple configuration can be obtained.

Of course, the present technology can be applied to any type of fluid such as other types of gases, and liquids such as water.

When, for example, the user 1 presses the deformation member 10, the deformation member 10 is deformed to yield according to the force of the pressing, as illustrated in FIG. 1B. Moreover, the deformation member 10 is deformed according to various operations such as tracing and pinching.

The specific configuration of the deformation member 10 is not limited, and the deformation member 10 may be designed discretionarily.

For example, the deformation member 10 may have a uniform thickness (the distance between the inner surface 10a and the outer surface 10b may be constant), or the deformation member 10 may have a nonuniform thickness.

Further, a material and the like are also not limited, and any deformable material such as polyethylene terephthalate (PET), a liquid crystal polymer, polyurethane, styrene, silicone, synthetic rubber, natural rubber, a material that is given a conductive function, and a material that is mixed with, for example, carbon to be more highly thermally conductive, may be used.

Furthermore, the deformation member 10 may also have a multilayered structure. When the deformation member has a two-or-more-layered structure, sealing properties, the strength of the deformation member 10, and a tactile sense providing function are easily provided at the same time.

A sealing material may be used for one of the layers of the deformation member 10 having a multilayered structure, and a porous material may be used for the other layer. For example, a foam sheet made of porous polyurethane may be used for one of the layers of the deformation member 10 having the multilayered structure to adjust a tactile sense providing function, that is, a feel to the touch.

In the present embodiment, the deformation member 10 is made of an opaque material to prevent the inside of the UI apparatus 100 to be visually confirmed. Without being limited thereto, the deformation member 10 may be made of a transparent or semitransparent material.

For example, a letter or a design may be provided on the outer surface 10b of the deformation member 10.

The fluid control mechanism 40 can deform the deformation member 10 by controlling the flow of fluid (air) with respect to the internal space S1. In the present embodiment, the fluid control mechanism 40 includes an inflow mechanism 41 and an outflow mechanism 42.

The inflow mechanism 41 can cause air to flow into the internal space S1 through an inflow opening 6a that is formed in the base 5.

The outflow mechanism 42 can cause air to flow out of the internal space S1 through an outflow opening 6b that is formed in the base 5.

The deformation member 10 (the inner surface 10a and the outer surface 10b) can be deformed by controlling the flow of air with respect to the internal space S1, that is, the flow of air into and out of the internal space S1.

For example, an inflow amount, an inflow speed, an inflow timing, and the like of air flowing into the internal space S1, and an outflow amount, an outflow speed, an outflow timing, and the like of air flowing out of the internal space S1 are controlled as appropriate, or combined as appropriate. This makes it possible to perform various kinds of deformation such as expansion/shrinkage of the deformation member 10, expansion/shrinkage of a portion of the deformation member 10, and movement such as an undulation of a surface of the deformation member 10.

In the present embodiment, the deformation of the deformation member 10 makes it possible to provide a tactile sense to the user 1 in contact with the outer surface 10b.

In other words, the fluid control mechanism 40 can control the flow of air such that, due to the deformation of the deformation member 10, a specified tactile sense is provided to the user 1 in contact with the deformation member 10.

For example, when air flows into the internal space S1 in a state in which the user 1 is in contact with the outer surface 10b, this makes it possible to provide a feeling of being pressed. Further, when air flows out of the internal space S1, this makes it possible to urge the user to perform further pressing with a finger or the like, or to cause the user to move the position of a finger or the like.

Further, a series of successively repeated tactile senses can be provided by, for example, repeating the inflow and outflow of air. Moreover, various kinds of tactile sense can be provided.

Since the present embodiment makes it possible to provide a tactile sense using air pressure, a mechanism used to provide a tactile sense can be easily implemented.

The specific configuration of the fluid control mechanism 40 is not limited, and the fluid control mechanism 40 may be designed discretionarily. For example, any actuator mechanism may be adopted in order to cause air to flow into and out of the internal space S1.

For example, a device such as a pump such as a vacuum pump, a compressor, a blower, a ventilator, or an impeller can be used.

Further, the internal space S1 and another fluid holding space communicate with each other through a valve mechanism. The valve mechanism includes any apparatus that can control a flow path resistance between the two spaces (the resistance is minimal when a valve is most open and the resistance is infinite when the valve is closed).

In a state in which there is a difference in pressure between the internal space S1 and the other fluid holding space, the valve mechanism is controlled to reduce the flow path resistance (to open the valve). This makes it possible to control the flow of air into and out of the internal space S1.

The actuator mechanism such as a pump or a compressor may be used in order to cause a difference in pressure from the other fluid holding space. Further, the other fluid retaining space may be formed in a portion of, for example, a pump or a compressor. Note that the other fluid holding space is also included in the external space.

Note that the fluid control mechanism 40 may be implemented by an apparatus that includes both the inflow mechanism 41 and the outflow mechanism 42. In other words, the fluid control mechanism 40 may be implemented by an apparatus that enables both the inflow and the outflow of air. Further, the fluid control mechanism 40 may be implemented by an apparatus that includes the inflow mechanism 41 and an apparatus that includes the outflow mechanism 42. In other words, the fluid control mechanism 40 may be implemented by combining an apparatus that enables the inflow of air and an apparatus that enables the outflow of air.

Further, the number of inflow mechanisms 41 and the number of outflow mechanisms 42 are not limited. For example, a plurality of inflow mechanisms 41 and a plurality of outflow mechanisms 42 may be used, or any number of inflow mechanisms 41 and any number of outflow mechanisms 42 may be used in combination.

Each of the plurality of signal sources 20 can emit a signal into the internal space S1.

The plurality of signal sources 20 is arranged in the base 5, and each of the plurality of signal sources 20 emits a signal toward the inner surface 10a of the deformation member 10.

Air which corresponds to fluid is transmitted through the plurality of signal sources 20, and each of the plurality of signal sources 20 emits a signal that can be reflected off the inner surface 10a. It can also be said that the inner surface 10a of the deformation member 10 can reflect signals respectively emitted by the plurality of signal sources 20.

In the present embodiment, a signal source 20a is arranged at the center of the base 5, as illustrated in FIG. 1A. Signal sources 20b and 20c are arranged such that the signal source 20a is situated between the signal sources 20b and 20c. The signal sources 20a to 20c are arranged in a line.

Further, signal sources 20c and 20d are arranged in a line orthogonal to a direction of the line in which the signal sources 20a to 20c are arranged, such that the signal source 20a is situated between the signal sources 20c and 20d. In the present embodiment, the five signal sources 20a to 20d are two-dimensionally arranged in the base 5 within the internal space S1, as described above.

Each signal source 20 is arranged to be capable of emitting a signal toward the inner surface 10a of the deformation member 10. Specifically, each signal source 20 is arranged to be oriented such that an emission direction in which a signal is emitted (a direction of an emission axis) coincides with a direction vertical to the base 5.

Of course, the configuration is not limited to such an arrangement. An arrangement in which the emission directions of the respective signal sources 20 are not the same can also be adopted. In other words, the emission directions of the respective signal sources 20 may be set to be different from each other. Moreover, any arrangement can be adopted.

For example, light is emitted as a signal.

The wavelength of the light is not limited, and may be set discretionarily. Note that, for example, a peak wavelength can be defined as the wavelength of the light.

For example, light of a wavelength in a range of wavelengths of ultraviolet light, visible light and infrared light, is emitted as a signal.

The specific configuration for emitting light is not limited, and any configuration may be adopted. For example, a solid-state light source such as a light emitting diode (LED) or a laser diode (LD) can be used as the signal source 20. Of course, other light sources may be used.

A radio wave may be emitted as a signal.

The wavelength of the radio wave is also not limited, and may be set discretionarily. For example, a radio wave such as a millimeter wave is emitted as a signal.

The specific configuration for emitting a radio wave is not limited, and any configuration may be adopted.

Note that light and a radio wave can each be defined on the basis of the wavelength. For example, a definition in which an electromagnetic wave of a wavelength in a range of between 10 nm and 100 μm is light, and an electromagnetic wave of a wavelength in a range of 100 μm or more is a radio wave, can be established. Of course, the configuration is not limited to such a definition.

Emission of an electromagnetic wave of an arbitrary wavelength as a signal includes, in concept, emission of light of an arbitrary wavelength as a signal, and emission of a radio wave of an arbitrary wavelength as a signal.

Sound (a sound wave) may be emitted as a signal.

The frequency (wavelength) of the sound is not limited, and may be set discretionarily.

For example, sound (a sound wave) of a frequency in a range including an audible range and an ultrasonic range is emitted as a signal. Note that, in the present disclosure, sound (a sound wave) includes, in concept, both a sound wave in the audible range and an ultrasonic wave.

The specific configuration for emitting a sound wave is not limited, and any configuration may be adopted. For example, a speaker or the like that has any configuration can be used as the signal source 20.

As described above, a configuration in which at least one of light, a radio wave, or sound is emitted as a signal can be adopted. Typically, one of light, a radio wave, and sound is selected and emitted by each of the plurality of signal sources 20. Without being limited thereto, two or more types of signals of any combination of two or more of light, a radio wave, and sound, may be emitted at the same time.

Only a single signal source 20 may be arranged.

A signal may be emitted through any other medium.

The plurality of sensors 30 is arranged out of contact with the deformation member 10 within the internal space S1. In other words, the plurality of sensors 30 serves as non-contact sensors.

The plurality of sensors 30 is arranged in the base 5, and detects signals emitted by the plurality of signal sources 20.

In the present embodiment, sensors 30a and 30b are arranged in the line in which the signal sources 20a to 20c are arranged, such that the signal source 20a arranged at the center is situated between the sensors 30a and 30b, as illustrated in FIG. 1A. The sensor 30a is arranged between the signal sources 20a and 20b. The sensor 30b is arranged between the signal sources 20a and 20c.

Further, sensors 30c and 30d are arranged in the line in which the signal sources 20a, 20d, and 20e are arranged, such that the signal source 20a arranged at the center is situated between the sensors 30c and 30d. The sensor 30c is arranged between the signal sources 20a and 20d. The sensor 30d is arranged between the signal sources 20a and 20e.

In the present embodiment, the four sensors 30a to 30d are two-dimensionally arranged in the base 5 within the internal space S1, as described above.

Each sensor 30 is arranged to be capable of detecting a signal reflected off the inner surface 10a of the deformation member 10. Specifically, each sensor 30 is arranged to be oriented such that a direction (an orientation) in which a signal is detected coincides with the direction vertical to the base 5.

Of course, the configuration is not limited to such an arrangement. An arrangement in which the detection directions of the respective sensors 30 are not the same can also be adopted. In other words, the detection directions of the respective sensors 30 may be set to be different from each other. Moreover, any arrangement can be adopted.

When light is emitted as a signal, any device that can detect light is used as the sensor 30. For example, a photo diode (PD) or a pyroelectric sensor can be used as the sensor 30. The specific configuration for detecting light is not limited, and any configuration may be adopted.

When a radio wave is emitted as a signal, any device that can detect a radio wave is used as the sensor 30. The specific configuration for detecting a radio wave is not limited, and any configuration may be adopted.

When sound (a sound wave) is emitted as a signal, any sensor that can detect sound (a sound wave) is used as the sensor 30. For example, a microphone can be used. The specific configuration for detecting a sound wave is not limited, and any configuration may be adopted.

As described above, a configuration in which at least one of light, a radio wave, or sound is detected can be adopted. Typically, the sensor 30 being capable of detecting one of light, a radio wave, and sound that is selected as a signal is arranged. When two or more types of signals of any combination of two or more of light, a radio wave, and sound, are emitted, the sensors 30 respectively being capable of detecting the signals are arranged in combination.

Only a single sensor 30 may be arranged.

The controller 50 controls operations of the respective blocks of the UI apparatus 100.

The controller 50 includes hardware, such as a CPU, a ROM, a RAM, and an HDD, that is necessary for a configuration of a computer. For example, processing related to a shape control method according to the present technology is performed by the CPU loading, into the RAM, a program according to the present technology that is recorded in, for example, the ROM in advance and executing the program.

For example, a PLD such as an FPGA, or a device such as an ASIC may be used as the controller 50. Further, any computer such as a personal computer (PC) may serve as the controller 50.

In the present embodiment, a generator is implemented as a functional block by the CPU executing a specified program. Of course, dedicated hardware such as an integrated circuit (IC) may be used in order to implement the functional blocks.

The program is installed on the UI apparatus 100 through, for example, various recording media. Alternatively, the installation of the program may be performed via, for example, the Internet.

The type and the like of a recording medium that records therein a program are not limited, and any computer-readable recording medium may be used. For example, any non-transitory computer-readable recording medium may be used.

In the present embodiment, deformation-related information regarding the deformation of the deformation member 10 is generated by the controller 50 on the basis of results of detections performed by the plurality of sensors 30. The deformation-related information includes any information regarding the deformation of the deformation member 10.

For example, the deformation-related information includes at least one of information regarding a shape of the deformation member 10 or information regarding a contact state of an object in contact with the deformation member 10. The object in contact with the deformation member 10 is, for example, a finger of the user 1. Of course, without being limited thereto, the object in contact with the deformation member 10 may include any object such as a tablet pen.

Examples of the information regarding a contact state of an object include the presence or absence of an object in contact with the deformation member 10, a position of an object in contact with the deformation member 10, the number of objects in contact with the deformation member 10, a size of an object in contact with the deformation member 10, a movement of an object in contact with the deformation member 10, a shape of an object in contact with the deformation member 10, and the type of an object in contact with the deformation member 10.

Of course, the information regarding a contact state of an object is not limited to these pieces of information.

In the present embodiment, information regarding a shape of the outer surface 10b or information regarding a contact state of an object in contact with the outer surface 10b is generated as the deformation-related information on the basis of a result of detecting a signal reflected off the inner surface 10a.

Examples of the information regarding a contact state of an object in contact with the outer surface 10b include the presence or absence of an object in contact with the outer surface 10b, a position of an object in contact with the outer surface 10b, the number of objects in contact with the outer surface 10b, a size of an object in contact with the outer surface 10b, a movement of an object in contact with the outer surface 10b, a shape of an object in contact with the outer surface 10b, and the type of an object in contact with the outer surface 10b.

Of course, the information regarding a contact state of an object in contact with the outer surface 10b is not limited to these pieces of information.

A method for calculating the deformation-related information is not limited, and any technology (such as an algorithm) may be used. For example, any machine learning algorithm using, for example, a deep neural network (DNN) may be used. For example, it is possible to improve the accuracy in calculating deformation-related information by using, for example, artificial intelligence (AI) that performs deep learning.

For example, a machine learning algorithm using a neural network such as a recurrent neural network (RNN), a convolutional neural network (CNN), or multilayer perceptron (MLP) is used. Moreover, any machine learning algorithm that performs, for example, supervised learning, unsupervised learning, semi-supervised learning, or reinforcement learning may be used.

A time-series DNN modeling method using, for example, the RNN from among the neural networks described above, particularly long-short term memory (LSTM), is effective. Of course, the configuration is not limited thereto.

For example, the controller 50 includes a learning section and an identification section (of which illustrations are omitted). The learning section performs machine learning on the basis of input information (training data), and outputs a learning result. Further, the identification section performs identification (such as determination and prediction) with respect to the input information on the basis of the input information and the learning result.

For example, a neural network and deep learning are used as a learning method performed by the learning section. The neural network is a model obtained by mimicking a human brain neural network, and includes three types of layers that are an input layer, an intermediate layer (a hidden layer), and an output layer.

The deep learning is a model using a neural network having a multilayered structure, where a complex pattern hidden in large volumes of data can be learned by characteristic learning being repeated in each layer.

The deep learning is used to, for example, identify an object in an image and a word in a vocalization. Of course, the deep learning can also be applied to the calculation of deformation-related information according to the present embodiment.

Further, a neurochip or a neuromorphic chip into which a concept of a neural network has been incorporated can be used as a hardware structure used to perform such machine learning.

Further, examples of the problem setting for machine learning include those for supervised learning, unsupervised learning, semi-supervised learning, reinforcement learning, inverse reinforcement learning, active learning, and transfer learning.

For example, in supervised learning, a feature value is learned on the basis of given labeled training data. This makes it possible to derive a label of unknown data.

Further, in unsupervised learning, large volumes of unlabeled training data are analyzed to extract a feature value, and clustering is performed on the basis of the extracted feature value. This makes it possible to analyze a trend and predict the future on the basis of large volumes of unknown data.

Furthermore, semi-supervised learning is an approach obtained by mixing supervised learning and unsupervised learning, where a feature value is learned using supervised learning, and then large volumes of training data are given using unsupervised learning. In this approach, learning is repeatedly performed while a feature value is automatically calculated.

Moreover, reinforcement learning deals with a problem in which an agent in an environment observes a current state to determine an action to be taken. The agent selects an action to obtain a reward from the environment, and learns a policy that maximizes rewards though a series of actions. The above-described learning of an optimal solution in an environment makes it possible to replicate the human judgement and to cause a computer to learn judgment better than the human judgement.

The controller 50 can also generate virtual sensing data using machine learning. For example, the controller 50 can predict a certain piece of sensing data from another piece of sensing data to use the predicted piece of sensing data as input information, such as generating positional information from input image information.

Further, the controller 50 can also generate a piece of sensing data from a plurality of other pieces of sensing data. Furthermore, the controller 50 can also predict necessary information and generate specified information from sensing data.

Further, any learning algorithm or the like other than machine learning may be used. It is possible to improve the accuracy in calculating deformation-related information by calculating the deformation-related information according to a specified learning algorithm.

Note that a learning algorithm may be applied to any processing in the present disclosure.

The deformation-related information is not limited to being generated using a learning algorithm. The deformation-related information can also be generated by, for example, statistical processing or any analysis processing.

For example, the statistical processing is performed on a result of detection performed by each of the plurality of sensors 30. Alternatively, the statistical processing is performed on a plurality of results of chronologically performed detections (or detections performed at a specified detection rate). Accordingly, the deformation-related information can be generated.

Examples of the statistical processing include various processes using, for example, a minimum value, a maximum value, a mean value, a mode, a median, a deviation, and a variance of a plurality of detection results (or a series of detection results). Alternatively, these values can also be selectively used as appropriate.

For example, it is also possible to, for example, find a malfunction on the basis of an outlier of the sensor 30.

Further, when the detection result varies greatly, it is possible to improve the accuracy in generating deformation-related information by trusting the median.

Various deformation-related information can be generated on the basis of results of detections performed by the plurality of sensors 30, as described above. Accordingly, the user 1 can input various operations using the UI apparatus 100 as a deformable interface.

In the present embodiment, the internal space S1 being capable of holding air is formed by the base 5 and the deformation member 10 being connected to each other, as illustrated in FIGS. 1A and 1B. Thus, the base 5 and the deformation member 10 form a space, and serve as a space forming section that includes a deformable member that is arranged in contact with the space. The fluid control mechanism 40 can also be considered a portion of the space forming section.

The fluid control mechanism 40 and the controller 50 serve as a fluid controller that can deform the member by controlling the flow of fluid with respect to the space. Further, the fluid control mechanism 40 and the controller 50 serve as a tactile sense providing section.

The plurality of signal sources 20 serves as a signal emitter that emits a signal into the space.

The plurality of sensors 30 is arranged out of contact with the member within the space, and serves as a detector that detects the emitted signal. The arrangement of the plurality of sensors 30 as non-contact sensors makes it possible to cope with a great deformation of the deformation member 10, and thus to generate various deformation-related information with a high degree of accuracy.

Note that, when light is emitted as a signal, the plurality of sensors 30 corresponds to a plurality of light emitters.

Figure 2:
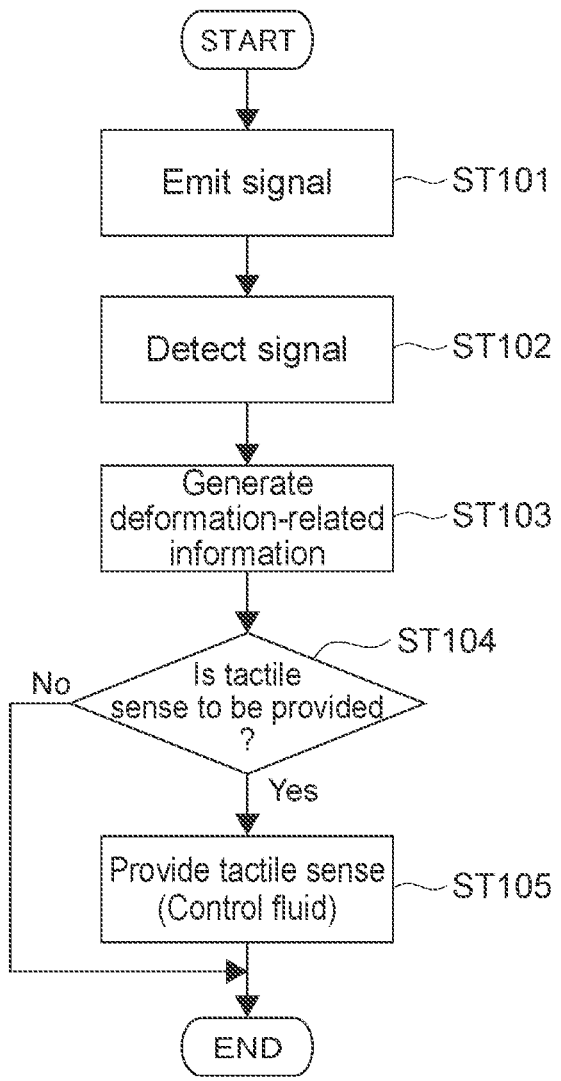
FIG. 2 is a flowchart illustrating an example of an operation of the UI

FIG. 2 is a flowchart illustrating an example of an operation of the UI apparatus 100. The example illustrated in FIG. 2 corresponds to an embodiment of the shape control method according to the present technology.

Signals are emitted into the internal space S1 by the plurality of signal sources 20 (Step 101).

The timing of emitting a signal is not limited. For example, signals may be sequentially emitted at a specified interval (detection rate). Further, a signal may be emitted when a specified trigger signal is received.

Signals are detected by the plurality of sensors 30 (Step 102).

The timing of detecting a signal, that is, the timing of outputting a result of the detection is not limited. For example, the result of the detection may be output at a timing synchronized with the emission performed by the signal source 20. Further, the results of the detections may be sequentially output at a specified interval (detection rate). Furthermore, the result of the detection may be output when a specified trigger signal is received.

Deformation-related information is generated by the controller 50 (Step 103).

The generated deformation-related information can be used discretionarily as input information input by the user 1.

For example, various operations performed by the user 1 on the deformation member 10 can be determined or estimated on the basis of the input information input by the user 1 (the deformation-related information).

For example, on the basis of the deformation-related information, the operation is determined to be an operation of pressing a center portion with a single finger that is the index finger. Further, the operation is determined to be an operation of pinching with two fingers that are the thumb and the index finger. Such determinations can be performed.

Note that the details of an operation such as the pressing operation or the pinching operation can also be generated as the deformation-related information.

Further, the following is an example of using the input information input by the user 1 (the deformation-related information). A light in a room is turned on in response to an operation of pressing a center portion of the outer surface 10b with a single finger (a single object). A buzzer placed in a room is sounded in response to an operation of pinching the outer surface 10b with two fingers (two objects). The various embodiments described above can be achieved.

Further, processing of a cooperation with a sense other than the tactile sense, such as a sense of sight or a sense of hearing, can be performed on the basis of the input information input by the user 1 (the deformation-related information), and a result of the processing can be provided as feedback to the user 1.

The deformation-related information is not limited to being used as input information input by the user 1. For example, the movement or the displacement of another apparatus or another mechanism may be detected on the basis of the deformation-related information. In this case, the apparatus may be called by a name different from a UI apparatus. Conversely, the present technology can be applied to an apparatus other than a UI apparatus.

It is determined, by the controller 50, whether a tactile sense is to be provided, on the basis of the deformation-related information (Step 104).

When it has been determined that the tactile sense is to be provided (Yes in Step 104), the entrance and exit of fluid is controlled by the fluid control mechanism 40 such that a specified tactile sense is provided to the user 1 in contact with the deformation member 10 (Step 105).

For example, the flow of fluid may be controlled on the basis of the generated deformation-related information. This makes it possible to provide a tactile sense depending on an input operation performed by the user 1.

For example, the deformation member 10 is expanded or shrunk according to a pressing motion (operation) of the user 1 to provide an instantaneous compression stimulus or oscillational stimulus. Accordingly, the user 1 experiences an operation feeling that he/she certainly performed pressing. Further, the deformation member 10 is expanded or shrunk according to a long-press movement (operation) of the user 1 to provide a continuous compression stimulus or oscillational stimulus. Accordingly, the user 1 experiences an operation feeling that he/she is certainly performing pressing.

When it is possible to provide various kinds of tactile sense, as described above, a touch upon pressing the deformation member 10 can be switched to various touches such as a touch upon pressing a push button, and a touch upon pressing an oscillational feedback button.

Of course, various kinds of tactile sense can be provided, for example, by the deformation member 10 being expanded to be repulsed due to the user 1 strongly performing pressing, or by the deformation member 10 being shrunk due to the user 1 strongly performing pinching.

Figure 21:
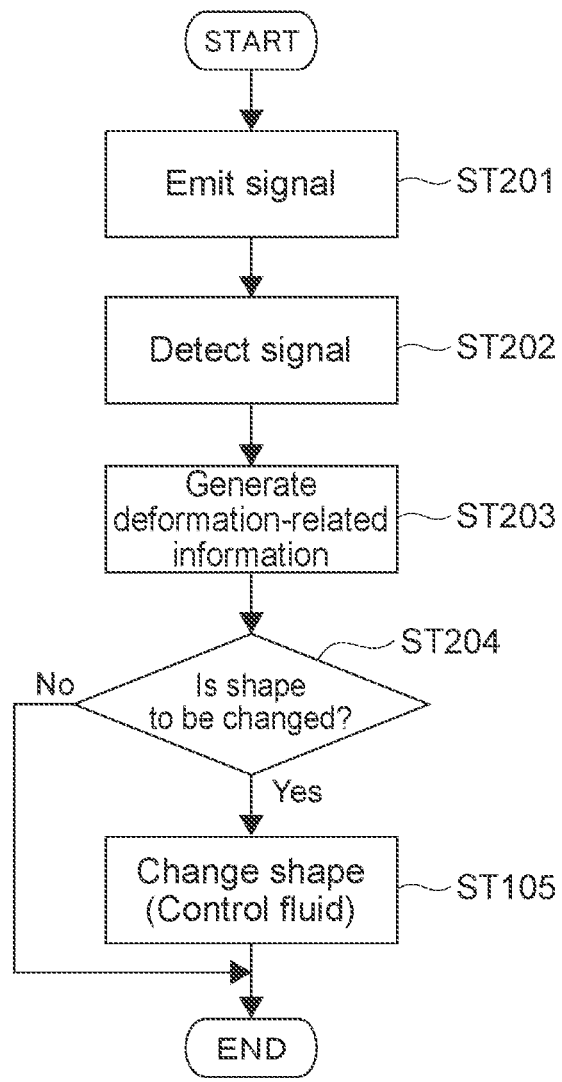
FIG. 21 is a flowchart illustrating another example of the operation of the UI apparatus.

FIG. 21 is a flowchart illustrating another example of the operation of the UI apparatus 100. The example illustrated in FIG. 21 also corresponds to an embodiment of the shape control method according to the present technology.

Steps 201 to 203 are similar to Steps 101 to 103 illustrated in FIG. 2.

Figure 22A:
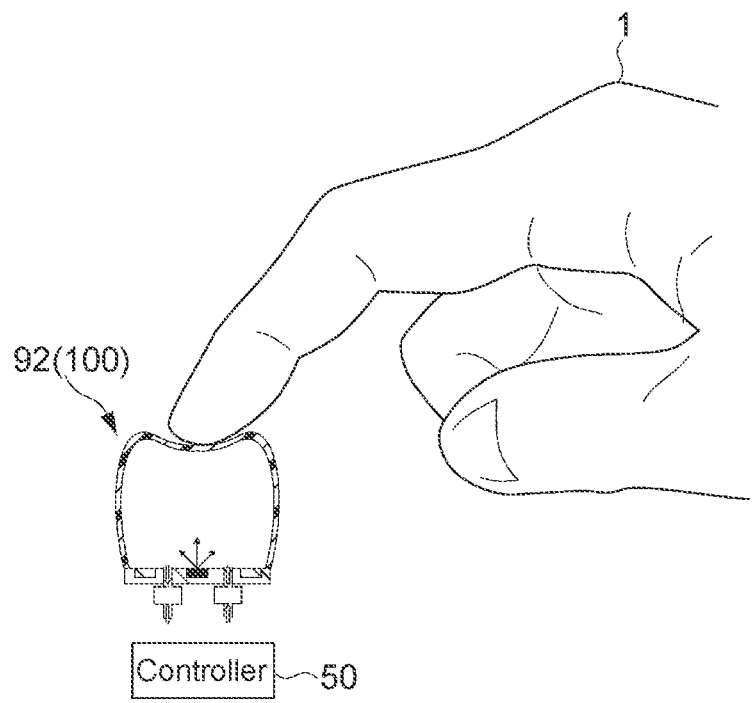
FIGS. 22A and 22B are schematic diagrams used to describe an example of using input information input by a user (deformation-related information).
Figure 22B:
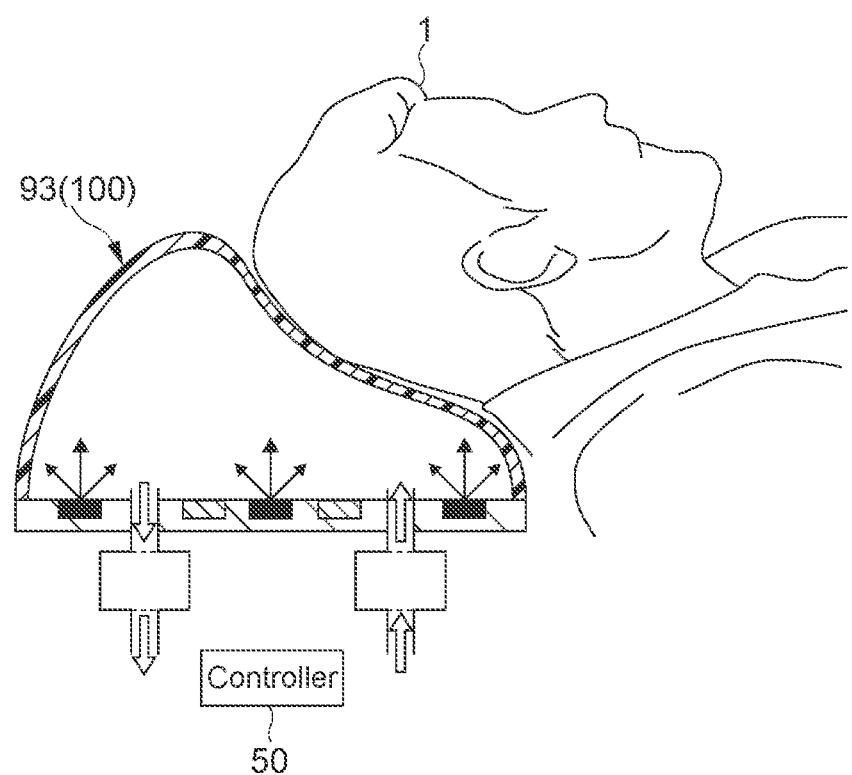

FIGS. 22A and 22B are schematic diagrams used to describe an example of using input information input by the user 1 (deformation-related information).

As illustrated in FIG. 22A, the UI apparatus 100 can be configured as a key 92 of a piano or a keyboard.

For example, it can be determined, on the basis of deformation-related information generated in response to a motion of pressing the key 92 being performed by the user 1, whether the key 92 is being pressed with an appropriate finger by an appropriate motion from the viewpoint of the improvement in skill.

For example, a size, a shape, a movement, and the like of a contact object are generated as deformation-related information. The controller 50 checks the deformation-related information against a previously held data set. This makes it possible to personally identify the user 1, and to determine which of the fingers is used and whether the motion is appropriate. Of course, machine learning or the like may be used.

It is possible to improve the skill regarding a motion of performing pressing with a finger with respect to, for example, a piano or a keyboard by, for example, a result of the determination being fed back to the user 1. Guide information or the like used to improve the skill may be provided to the user 1.

As illustrated in FIG. 22B, the UI apparatus 100 can be configured as a pillow 93.

For example, information regarding, for example, a body part of a person, a size of the whole body of the person, a shape of the person, and a pose of the person can be acquired on the basis of deformation-related information generated in response to a pressing motion being performed when the user 1 uses the pillow 93.

For example, a size, a shape, a movement, and the like of a contact object are generated as deformation-related information. The controller 50 checks the deformation-related information against a previously held data set. This makes it possible to personally identify the user 1, and to determine which of the body parts it is and whether the pose in his/her sleep is appropriate. Of course, machine learning or the like may be used.

It is possible to grasp a contact state of the pillow 93 in contact with the body by, for example, the pieces of information described above being fed back to the user 1, and thus to take actions for a sleep of better quality, such as selecting a pillow suitable for the user 1 and improving a pose during sleep. This results in being able to improve a sleep state.

Note that the present technology can be applied not only to a pillow, but also to, for example, furniture such as a sofa or a bed on which the user 1 sits or lies. When the UI apparatus 100 is configured as a sofa or a bed, this makes it possible to acquire information regarding a contact state of the body, and to improve, for example, a feeling provided in use.

The various embodiments described above can be achieved.

For example, the movement or the displacement of another apparatus or another mechanism may be detected on the basis of the deformation-related information. In this case, the apparatus may be called by a name different from a UI apparatus. Conversely, the present technology can be applied to an apparatus other than a UI apparatus.

It is determined, by the controller 50, whether a shape is to be changed by fluid being controlled, on the basis of the deformation-related information (Step 204).

When it has been determined that the shape is to be changed by fluid being controlled (Yes in Step 204), the entrance and exit of fluid is controlled by the fluid control mechanism 40 (Step 205).

As described above, fluid may be controlled to deform the deformation member 10 into a specified shape rather than providing a tactile sense, on the basis of the deformation-related information. For example, the deformation member 10 can be expanded to be larger in size in response to the deflated deformation member 10 being lightly pushed.

Further, for example, the shape of a surface onto which a video of a character or a UI button is projected is changed to a desired shape. For example, the shape is changed to be closer to a shape corresponding to video information that the user 1 is viewing. The various embodiments described above can be achieved.

Note that, when the shape is changed, it can also be determined whether the shape is properly getting closer to a specified shape, by generating and referring to deformation-related information in real time, the deformation-related information being based on results of detections performed by the plurality of sensors 30. This results in changing a shape with a high degree of accuracy.

[Relationship Between Deformation of Deformation Member and Result of Detection Performed by Sensor]

In order to examine a relationship between the deformation of the deformation member 10 and a result of detection performed by the sensor 30, various experiments were conducted.

Figure 3:
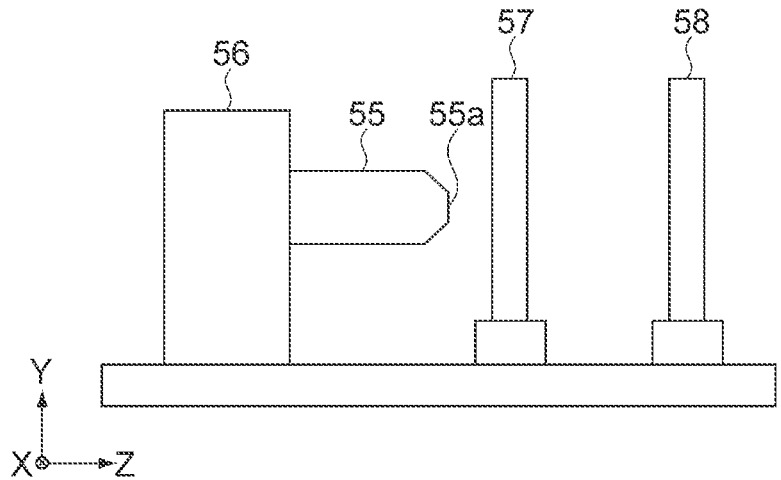
FIG. 3 is a schematic diagram used to describe an outline of an experiment conducted to examine a relationship between a motion of tracing performed with an object and a result of detection performed by a sensor.
Figure 4:
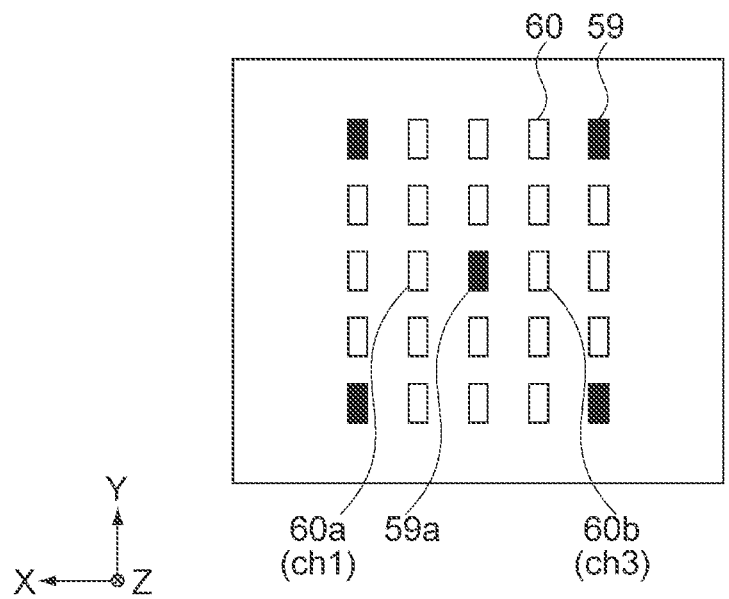
FIG. 4 is a schematic diagram used to describe the outline of the experiment conducted to examine the relationship between the motion of tracing performed with the object and the result of detection performed by the sensor.

FIGS. 3 and 4 are schematic diagrams used to describe an outline of an experiment conducted to examine a relationship between a motion of tracing performed with an object and a result of detection performed by the sensor 30.

As illustrated in FIG. 3, an XYZ-axis stage 56 to which a tracing probe 55 is attached, a deformable film member 57, and a base 58 are arranged.

The XYZ-axis stage 56 can move the tracing probe 55 in respective directions of axes of X, Y, and Z that are orthogonal to each other.

In the present embodiment, the tracing probe is attached to the XYZ-axis stage 56 to extend in a Z direction, as illustrated in FIG. 3.

Due to the operation of the XYZ-axis stage 56, a tip 55a of the tracing probe 55 is moved in the respective directions of the axes of X, Y, and Z.

The film member 57 and the base 58 are arranged vertical to the Z direction. The film member 57 and the base 58 are respectively fixed at specified positions at a specified interval to face each other. The respective devices are arranged in order of the XYZ-axis stage 56 (the tracing probe 55), the film member 57, and the base 58, as viewed in the Z direction.

The XYZ-axis stage 56 makes it possible to press the tip 55a of the tracing probe 55 toward the base 58 from a position at which the tip 55a of the tracing probe 55 comes into contact with the surface of the film member 57. Further, the XYZ-axis stage 56 can move the pressed tip 55a of the tracing probe 55 in an X direction and a Y direction.

Note that the XYZ-axis stage 56 is moved for every one millimeter. In other words, the measurement resolution in this experiment is 1 mm.

FIG. 4 schematically illustrates a surface of the base 58 that is situated on the side of the film member 57.

A plurality of near infrared LEDs 59 and a plurality of light-receiving sensors 60 are arranged in the base 58.

The total number of the arranged plurality of near infrared LEDs 59 and the arranged plurality of light-receiving sensors 60 is 25, with five in length×five in width. The intervals (pitches) in the X direction and the Y direction are 5 mm.

Five near infrared LEDs 59 in total are arranged at the center and at four corners.

20 light-receiving sensors 60 in total are arranged at the other places.

The plurality of near infrared LEDs 59 and the plurality of light-receiving sensors 60 can be individually controlled.

(First Experiment)

A near infrared LED 59a at the center was turned on.

Results of detections performed by light-receiving sensors 60a and 60b that are adjacent to the near infrared LED 59a on the left and the right of the near infrared LED 59a were acquired. The light-receiving sensor 60a on the left was set to be ch1, and the light-receiving sensor 60b on the right was set to be ch3.

The tip 55a of the tracing probe 55 was pressed toward the base 58 by 6 mm from a position at which the tip 55a of the tracing probe 55 comes into contact with the surface of the film member 57.

In that state, a line in which the near infrared LED 59a and the light-receiving sensors 60a and 60b are arranged, was traced by the tracing probe 55. In other words, a tracing operation was performed with respect to the tops of the near infrared LED 59a and the light-receiving sensors 60a and 60b (from the front).

Tracing was performed in a range of 10 mm to the left and 10 mm to the right from the near infrared LED 59a (20 mm in total). For every one millimeter, tracing was performed by the tracing probe 55 being moved from one of left and right ends to the other end in this range.

Figure 5:
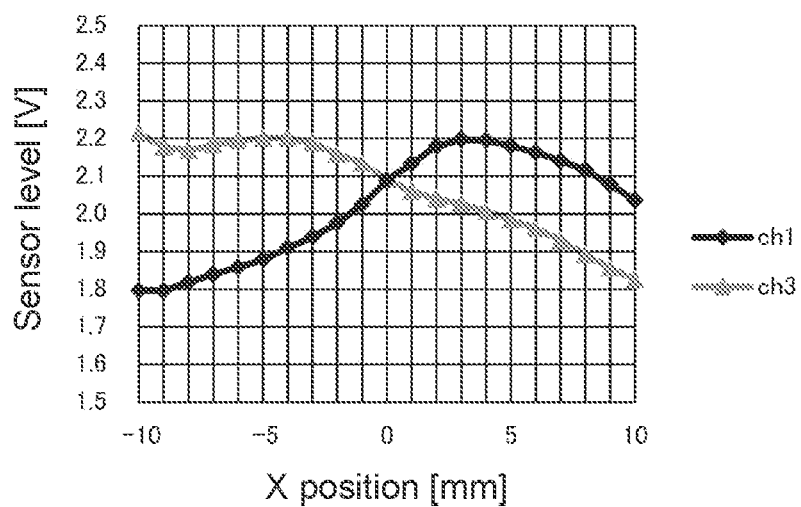
FIG. 5 is a graph of an experimental result of a first experiment.

FIG. 5 is a graph of an experimental result.

In this experiment, a PD was used as the light-receiving sensor 60, and voltage was measured as a sensor level.

An inter-CH correction is processing of correcting for, for example, variations in characteristics between the light-receiving sensors 60a and 60b. For example, when the tracing probe 55 is at the position X=0 between the light-receiving sensors 60a and 60b, the inter-CH correction is performed such that the sensor levels of both of the sensors are equal.

Of course, the inter-CH correction may be performed not only upon experiment, but also as appropriate with respect to the plurality of sensors 30 included in the UI apparatus 100. This makes it possible to improve the accuracy in generating deformation-related information.

(Second Experiment)

As in the case of the first experiment, in a state of the near infrared LED 59a at the center being turned on, results of detections performed by the light-receiving sensors 60a and 60b were acquired.

As in the case of the first experiment, an operation of tracing in the same range with a pressing amount of 6 mm was performed.

In addition, an operation of tracing in the same range with a pressing amount of 7 mm was performed.

Figure 6:
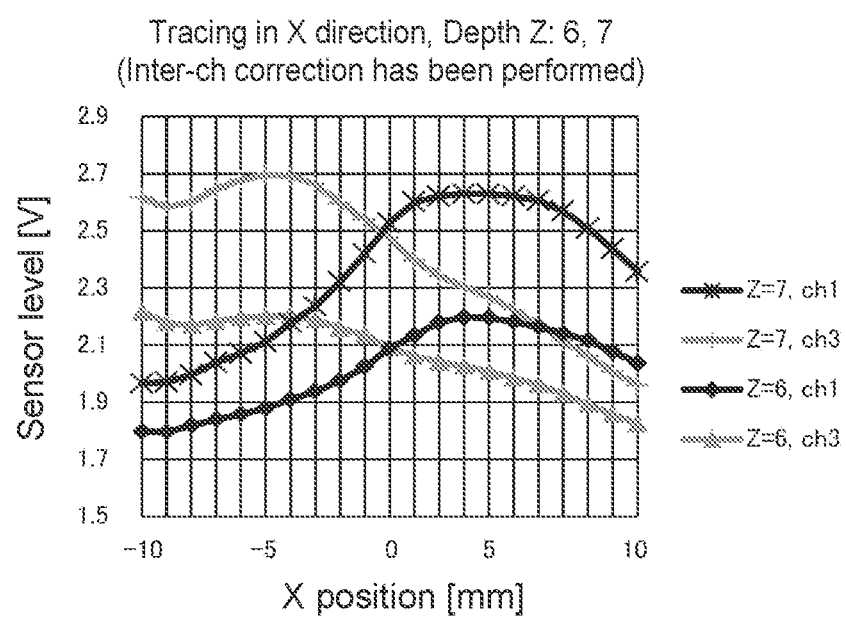
FIG. 6 is a graph of an experimental result of a second experiment.

FIG. 6 is a graph of an experimental result.

Note that, with respect to the operation of tracing in the same range with a pressing amount of 6 mm, substantially the same result as the first experiment was obtained in a second experiment, although the second experiment is an experiment different from the first experiment.

Note that a substantially similar result was also obtained when an operation of tracing in another direction or in an oblique direction was performed, or when an operation of tracing with another pressing amount was performed.

Figure 7A:
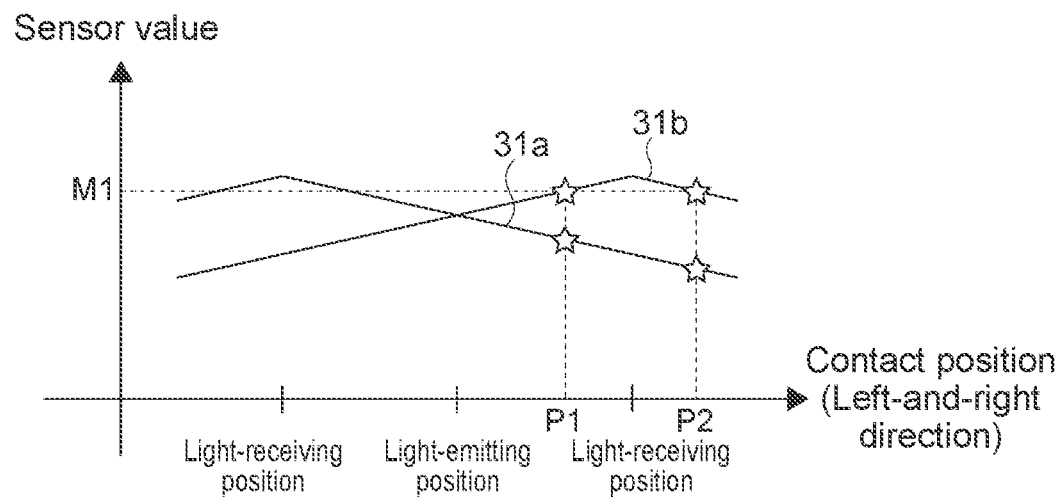
FIGS. 7A and 7B are diagrams used to describe findings obtained by repeating the first experiment.
Figure 7B:
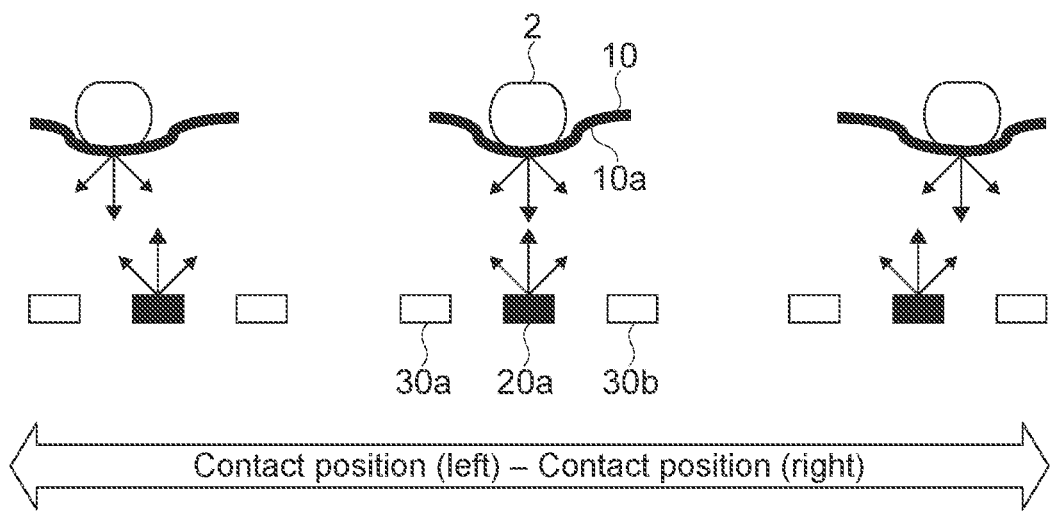

FIGS. 7A and 7B are diagram used to describe findings obtained by repeating the first experiment.

As illustrated in FIG. 7B, sensors (light-receiving sensors) 30a and 30b that each detect light were arranged in a line such that a signal source (a light emitter) 20a that emits light was situated between the sensors 30a and 30b.

The deformation member 10 in the form of a film was arranged above the signal source 20a and the sensors 30a and 30b, and the line in which the signal source 20a and the sensors 30a and the 30b were arranged was traced from side to side.

Since the deformation member 10 was deformed according to an operation of tracing performed with an object 2, a state of light reflected off the inner surface 10a of the deformation member 10 was also changed, as schematically illustrated in FIG. 7B.

As illustrated in a graph of FIG. 7A, a sensor value 31a is represented by a shape obtained by inverting a shape representing a sensor value 31b left to right, the sensor value 31a being a result of detection performed by the sensor 30a, the sensor value 31b being a result of detection performed by the sensor 30b. In other words, the sensor value 31a and the sensor value 31b are symmetrical with respect to a light-emitting position of the signal source 20a.

Further, the sensor value 31a of the sensor 30a was largest when the object 2 was situated just above the sensor 30a. The sensor value 31b of the sensor 30b was largest when the object 2 was situated just above the sensor 30b.

As a result of repeating the first experiment, an experimental result as illustrated in FIG. 5 was often obtained, and trends as illustrated in FIG. 7A were seen.

Note that, for example, the sensor value 31b at a position P1 and the sensor value 31b at a position P2 were values (M1) identical to each other when only the sensor 30b was arranged. In other words, depending on the position, the identical sensor value 31b was exhibited in some cases.

However, it can be determined whether the position is the position P1 or the position P2 by referring to the sensor value 31a of the sensor 30a.

The above-described arrangement of the plurality of sensors 30 makes it possible to improve the accuracy in generating deformation-related information. Further, this makes it possible to generate a higher level of deformation-related information, such as information including not only a position but also, for example, unevenness.

Figure 8:
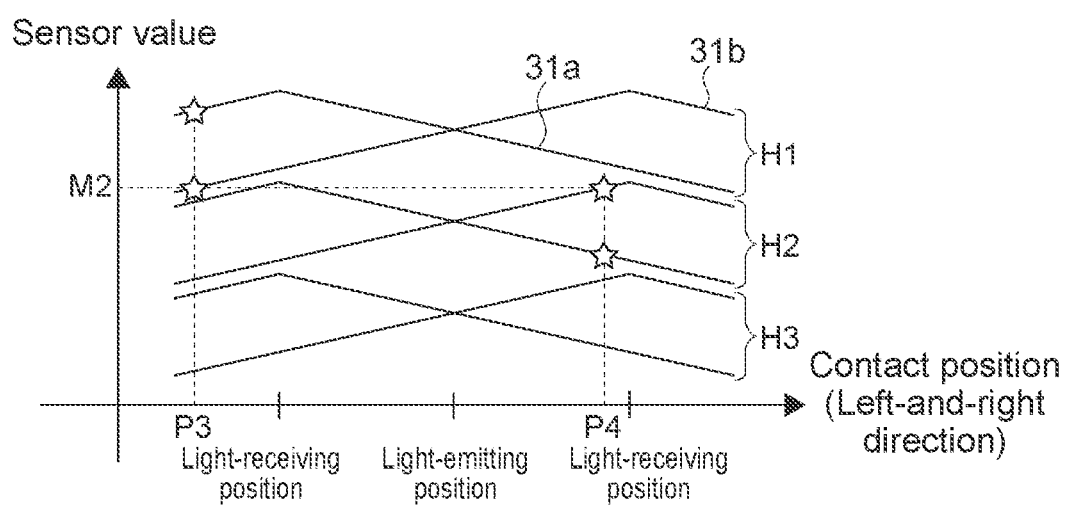
FIG. 8 is a diagram used to describe findings obtained by repeating the second experiment.

FIG. 8 is a diagram used to describe findings obtained by repeating the second experiment.

The tracing operation was performed in the same range as in FIGS. 7A and 7B, with an amount of pressing performed with the object 2 being changed. For example, the tracing operation was performed under the condition that height H1<height H2<height H3. The height H is a height of the object 2 that is measured from the level at which the signal source 20a and the sensors 30a and 30b are arranged.

As illustrated in FIG. 8, graphs of the sensor values 31a and 31b show that the sensor values 31a and 31b vary throughout in magnitude (intensity level), with shapes that represent the sensor values 31a and 31b remaining unchanged.

In the graph of the height H1 corresponding to the case of a large pressing amount, the sensor values 31a and 31b are relatively large. The sensor values 31a and 31b are relatively smaller (from H2 to H3) if the pressing amount is smaller, that is, if the height is higher.

As a result of repeating the second experiment, an experimental result as illustrated in FIG. 6 was often obtained, and trends as illustrated in FIG. 8 were seen.

Note that, for example, the sensor value 31a at a position P3 with the height H1 and the sensor value 31a at a position P4 with the height H2 were values (M2) identical to each other when only the sensor 30b was arranged. In other words, when there was a change in the pressing amount, the identical sensor value 31a was exhibited in some cases.

However, it can be determined whether the position is the position P3 or the position P4 by referring to the sensor value 31a of the sensor 30a.

The above-described arrangement of the plurality of sensors 30 makes it possible to improve the accuracy in generating deformation-related information. Further, this makes it possible to generate a higher level of deformation-related information.

It has turned out that results of detections performed by the sensors 30a and 30b are obtained according to the deformation of the deformation member 10 depending on the position of the object 2, as illustrated in FIGS. 7A, 7B and 8. In other words, it has turned out that there is a correlation between the deformation of the deformation member 10 (a contact state of the object 2) and results of detections performed by the sensors 30a and 30b.

Note that the correlation between the deformation of the deformation member 10 (a contact state of the object 2) and results of detections performed by the sensors 30a and 30b may differ depending on an apparatus configuration (such as a signal-reflection property of the deformation member 10, and the arrangement of the signal source 20 and the sensor 30).

For example, the results illustrated in FIGS. 5, 6, 7A, 7B and 8 can be considered results showing that there is a strong correlation between the height of the object 2 (a pressing amount) and the intensity level corresponding to a sensor value. The results illustrated in FIGS. 5, 6, 7A, 7B and 8 is likely to be obtained when, for example, designing is performed with respect to the reflection property of the inner surface 10a of the deformation member 10, such that the diffusely reflective property is stronger than the specular reflection property. Further, the results illustrated in FIGS. 5, 6, 7A, 7B and 8 is also likely to be obtained when designing is performed such that the distance between a plane in which the signal source 20 and the sensor 30 are arranged, and the inner surface 10a is small.

Figure 9A:
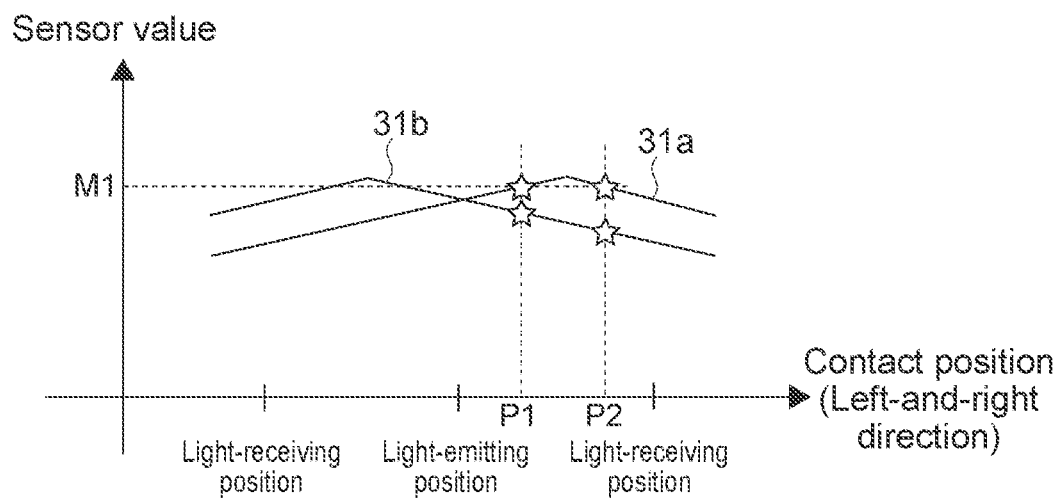
FIGS. 9A and 9B are diagrams used to describe a correlation that is provided by another apparatus configuration between the deformation of a deformation member (a contact state of the object 2) and results of detections performed by the sensors.
Figure 9B:
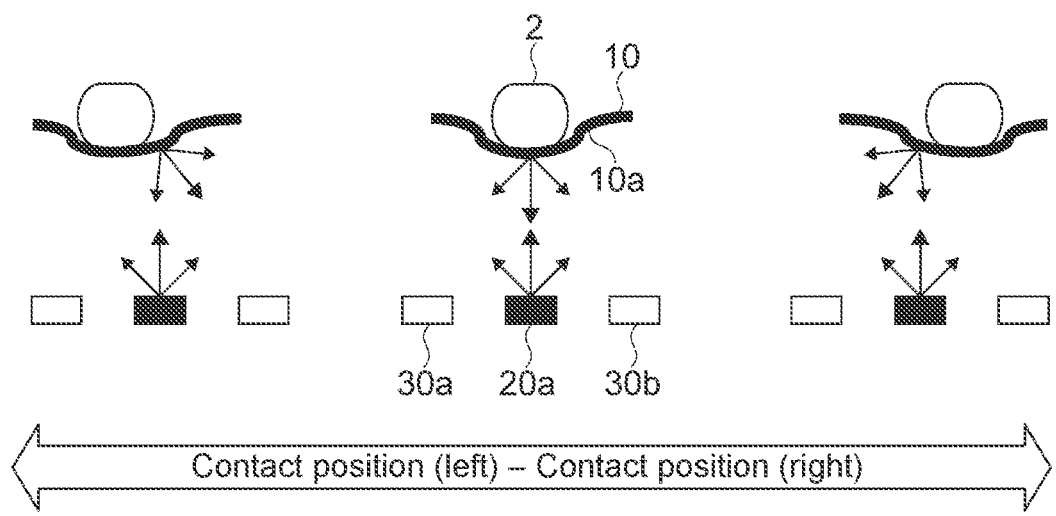

FIGS. 9A and 9B are diagrams used to describe a correlation that is provided by another apparatus configuration between the deformation of the deformation member 10 (a contact state of the object 2) and results of detections performed by the sensors 30a and 30b.

For example, designing was performed with respect to the reflection property of the inner surface 10a of the deformation member 10, such that the specular reflection property was stronger than the diffusely reflective property.

In this case, trends of a sensor value as illustrated in FIG. 9A were seen. In other words, the sensor value 31a of the sensor 30a was largest when the object 2 was situated between the light-emitting position of the signal source 20a and the light-receiving position of the sensor 30b. Further, the sensor value 31a of the sensor 30b was largest when the object 2 was situated between the light-emitting position of the signal source 20a and the light-receiving position of the sensor 30a.

This result is likely to show that there is a strong correlation between an angle (a direction) of a reflection of a signal depending on the shape of the inner surface 10a and the intensity level corresponding to a sensor value, as illustrated in b-of-FIG. 9B. For example, the result illustrated in FIGS. 9A and 9B are also likely to be obtained when designing is performed such that the distance between a plane in which the signal source 20 and the sensor 30 are arranged, and the inner surface 10a is large.

As described above, the correlation may differ depending on the apparatus configuration, and it has turned out that there is a correlation between the deformation of the deformation member 10 (a contact state of the object 2) and results of detections performed by the sensors 30a and 30b. Further, it has turned out that specified trends of the correlation will be seen if the apparatus configuration is determined.

Further, there is a correlation between the deformation of the deformation member 10 (a contact state of the object 2) and results of detections performed by the sensors 30a and 30b regardless of the type of signal. Of course, the correlation may differ depending on the type of signal, but it can be said that there is the correlation. Further, trends of the correlation depending on the apparatus configuration were also seen.

Note that this experiment is an experiment performed when the film member 57 and the base 58 are arranged in parallel, as illustrated in FIG. 3. As a result of this experiment, it has turned out that, for example, there is a correlation between the position of the object 2 or the shape of the inner surface 10b or the like, and results of detections performed by the sensors 30a and 30b.

For example, in the UI apparatus 100 illustrated in FIGS. 1A and 1B, the deformation member 10 having a hemispherical outer shape is connected to the peripheral edge of the base 5 having a circular-plate shape.

The plurality of signal sources 20 and the plurality of sensors 30 are also arranged at specified positions in the base 5 in the apparatus configuration described above. Consequently, there is a correlation between the contact position at which the user 1 is in contact with the deformation member 10 or a shape into which the inner surface 10a of the deformation member 10 is formed due to, for example, the user 1 being brought into contact with the deformation member 10 or the like, and results of detections performed by the plurality of sensors 30, as in the case of the experiment described above. Further, the correlation can be found out by assembling the UI apparatus 100 and performing, for example, an experiment or calibration.

Generating deformation-related information regarding the deformation of the deformation member 10 on the basis of results of detections performed by the plurality of sensors 30, has been found out on the basis of the findings described above.

Figure 10:
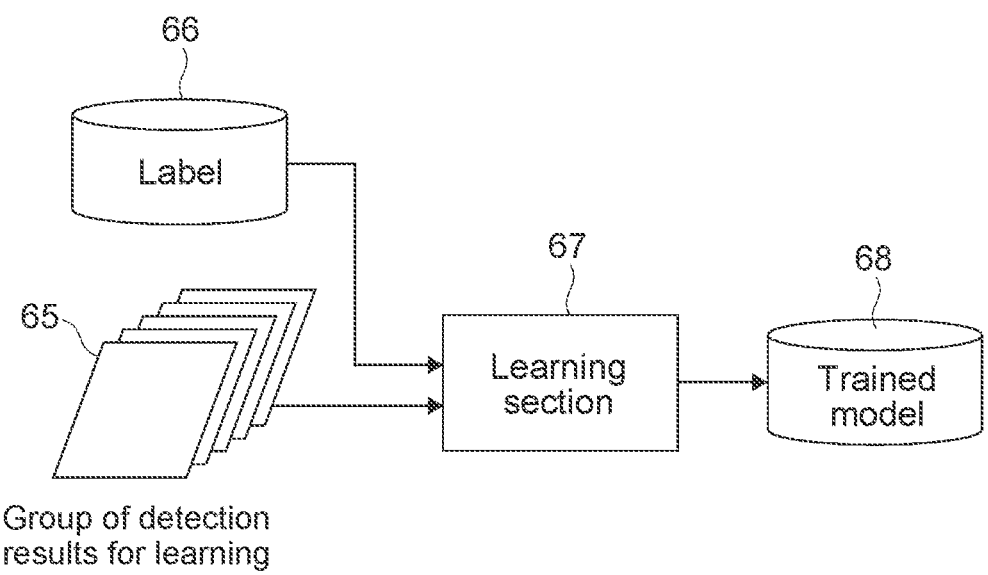
FIG. 10 is a schematic diagram used to describe an example of generating a trained model used to generate deformation-related information.

FIG. 10 is a schematic diagram used to describe an example of generating a trained model used to generate deformation-related information.

A group 65 of detection results for learning and a label 66 are input to a learning section 67.

The label 66 is information associated with each detection result for learning and is deformation-related information to be generated.

For example, the UI apparatus 100 is assembled such that the UI apparatus 100 has a specified apparatus configuration, and a detection result depending on the shape of the deformation member 10 and a detection result depending on a contact state of an object are acquired by performing, for example, an experiment or calibration. With respect to the acquired detection result, deformation-related information to be acquired as output of machine learning is set to be the label 66.

For example, it is assumed that a specified position is traced with a single finger. A detection result obtained by performing this operation is stored as a detection result for learning. Then, deformation-related information regarding the operation of tracing a specified position with a single finger is set to be the label 66.

Examples of the deformation-related information include "the presence of a contact object", "a contact position", "a tracing trajectory", "being in contact with a single finger", "a size of a finger", "being a tracing motion", "a shape of a finger", "an object is a finger", and "a speed of movement". Of course, the deformation-related information is not limited to those examples.

As described above, a result of detection performed by the sensor 30 that is used as input of machine learning is associated with deformation-related information to be output according to a machine learning algorithm to generate a data set for learning.

Note that a data set for learning that is generated in advance may be acquired to be input to the learning section 67.

Learning is performed by the learning section 67 using a data set for learning on the basis of a machine learning algorithm. A parameter (a coefficient) used to generate deformation-related information is updated by learning being performed, and a parameter on which learning has been performed is generated. A program into which the generated parameter on which learning has been performed is incorporated, is generated as a trained model 68.

Deformation-related information is calculated using the trained model 68 with respect to input of a result of detection performed by the sensor 30.

Note that the input of machine learning is not limited to being a result of detection performed by the sensor 30. For example, information such as a parameter that is generated on the basis of a result of detection performed by the sensor 30 may be used as input of machine learning. Then, deformation-related information may be generated according to a machine learning algorithm.

Further, the learning section 67 may be situated outside of the UI apparatus 100. The trained model 68 generated by the learning section 67 performing learning may be acquirable through, for example, a network.

FIGS. 11A, 11B, 11C, 11D, 11 E and 11F are schematic diagrams used to describe an example of deformation-related information that can be acquired using the present technology.

Figure 11C:
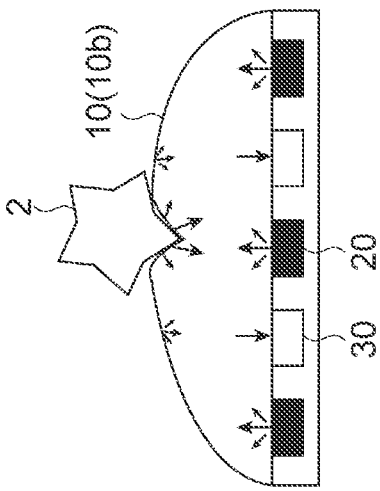
FIGS. 11A, 11B, 11C, 11D, 11E and 11F are schematic diagrams used to describe an example of deformation-related information that can be acquired using the present technology.
Figure 11F:
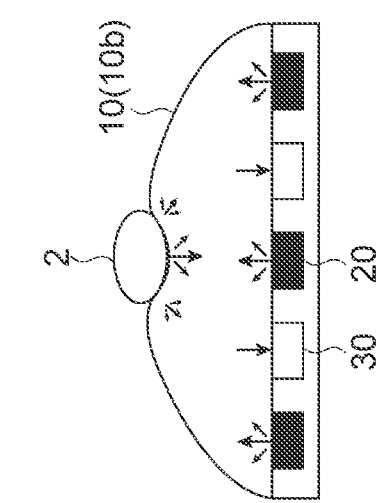
Figure 11B:
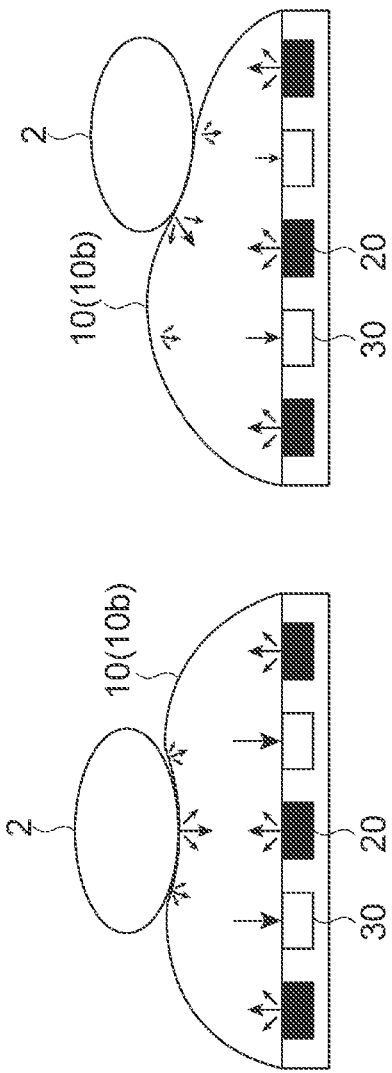
Figure 11E:
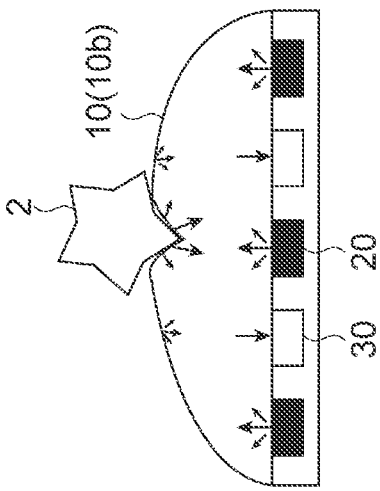
Figure 11A:
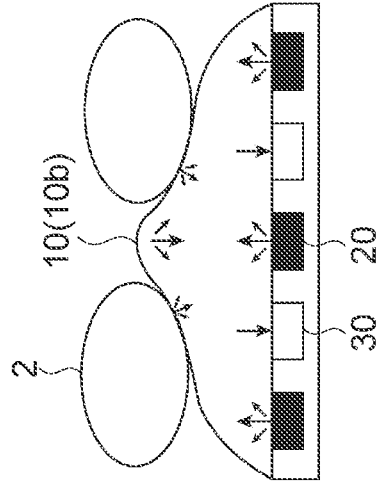

Referring to FIGS. 11A and 11B, deformation-related information regarding the presence or absence of the object 2 in contact with the deformation member 10 (the outer surface 10b) can be acquired.

Figure 11D:
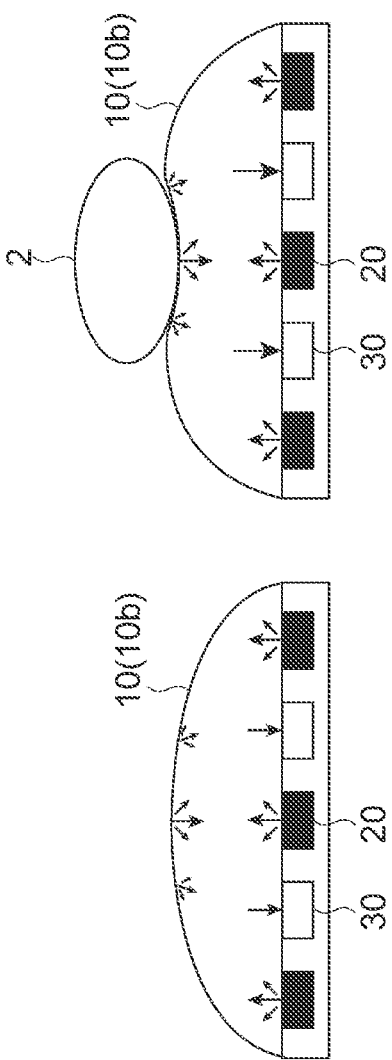

Referring to FIGS. 11B, 11C and 11D, deformation-related information regarding a position of the object 2 in contact with the deformation member 10 (the outer surface 10b), and deformation-related information regarding the number of objects 2 in contact with the deformation member 10 (the outer surface 10b) can be acquired.

Referring to FIG. 11D, deformation-related information regarding a movement of the object 2 in contact with the deformation member 10 (the outer surface 10b), such as pinching, can be acquired. For example, deformation-related information regarding various operations such as tracing, pinching, stroking, tilting, turning, shifting, and nipping that are input by the user 1 can be acquired.

Referring to FIGS. 11B and 11E, deformation-related information regarding a size of the object 2 in contact with the deformation member 10 (the outer surface 10b) can be acquired.

Referring to FIGS. 11B and 11F, deformation-related information regarding a shape of the object 2 in contact with the deformation member 10 (the outer surface 10b), and deformation-related information regarding the type of object 2 in contact with the deformation member 10 (the outer surface 10b) can be acquired.

Note that deformation-related information may be checked against known data when the deformation-related information is acquired.

For example, shape data depending on the type of object, such as "a thumb", "a pencil", and "a banana", is stored as known data. The controller 50 calculates the shape of the deformation member 10 on the basis of a result of detection performed by the sensor 30. Then, the shape corresponding to a calculation result is checked against the stored known data to determine the type of object 2. Deformation-related information regarding the type of object may be calculated, as described above. Of course, the shape corresponding to a calculation result, which is to be checked against known data, is also information that is included in deformation-related information.

Of course, not only deformation-related information regarding the type of object, but also other deformation-related information such as deformation-related information regarding a movement of the object 2 may be checked against known data.

Further, table information or the like in which the shape of the deformation member 10 and the movement or the like of the object 2 are associated with each other may be referred to as appropriate. For example, the shape of the deformation member 10 may be calculated on the basis of a result of detection performed by the sensor 30, then the table information or the like may be referred to, and deformation-related information may be generated.

For example, different processes can be performed according to the input on the basis of deformation-related information regarding the type of object 2. For example, when the object 2 is a "finger" of the user 1, a process corresponding to a movement of a hand is performed. When the object 2 is a "pencil", a process corresponding to a motion of writing or painting is performed. As described above, a function of the UI apparatus 100 can be switched according to the type of object 2.

Different pieces of tactile-sense feedback can also be provided according to the motion of the user 1. For example, various pieces of tactile-sense feedback can be provided using a configuration that makes it possible to provide various kinds of tactile sense and the present technology in combination.

For example, a motion of tracing performed by the user 1, a direction of the tracing, and a speed of the tracing can be acquired as deformation-related information by adopting a configuration that makes it possible to provide a tactile sense such as a feeling of touching fur. This makes it possible to provide different pieces of tactile-sense feedback according to, for example, a direction and a speed of tracing. This results in being able to represent, for example, the direction and the hardness of hair using a difference in touch.

Further, a feeling of unevenness can also be finely replicated using an oscillation in synchronization with a displacement of tracing.

Furthermore, an accurate tactile sense can be provided without an individual difference by correcting for variations due to individual difference in, for example, how to touch. For example, in a system that provides a specified tactile sense when a specified motion is performed at a specified position, a tactile sense provided to the user 1 (a touch felt by the user 1) may vary due to variations in position or variations in motion.

The present technology makes it possible to detect variations in position and variations in motion with a high degree of accuracy. Thus, the provision of a tactile sense can be finely controlled, and a specified tactile sense can be accurately fed back.

[Example of Arrangement of Signal Source and Sensor]

FIGS. 12A, 12B, 12C, 12D and 12E schematically illustrates a variation of an arrangement of the signal source 20 and the sensor 30.

Figure 12A:
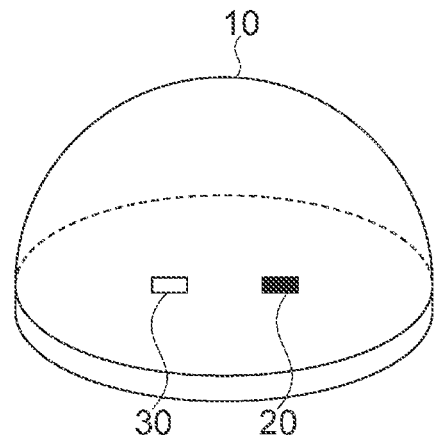
FIGS. 12A, 12B, 12C, 12D and 12E schematically illustrates a variation of an arrangement of a signal source and the sensor.

A single signal source 20 and a single sensor 30 may be arranged, as illustrated in FIG. 12A. This makes it possible to, for example, make an apparatus configuration simple, reduce power consumption, and reduce costs.

Figure 12B:
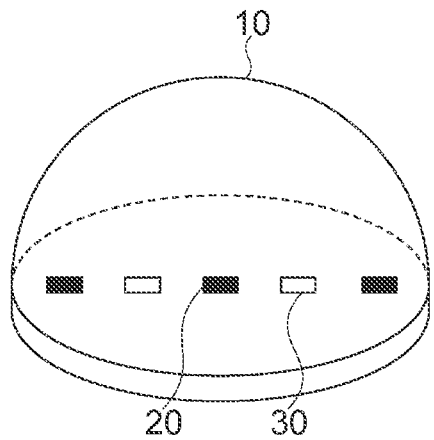

A plurality of signal sources 20 and a plurality of sensors 30 may be arranged in a single line, as illustrated in FIG. 12B. Such a configuration makes it possible to acquire high-level deformation-related information such as information including, for example, unevenness with respect to a direction of the line in which the plurality of signal sources 20 and the plurality of sensors 30 are arranged.

A plurality of signal sources 20 and a plurality of sensors 30 may be two-dimensionally arranged, as illustrated in FIGS. 12C, 12D, 12E, 1A and FIG. 1B. This makes it possible to acquire high-level deformation-related information such as information including, for example, a two-dimensional inclination and unevenness, and a small change in shape.

Figure 12C:
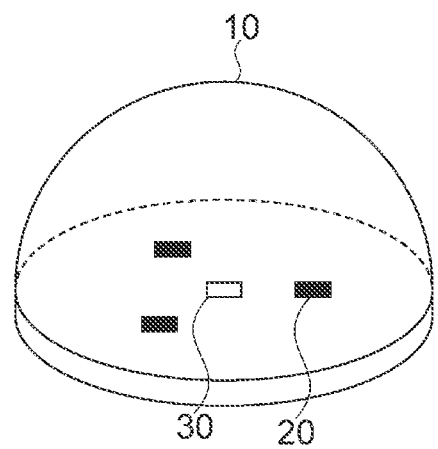
Figure 12D:
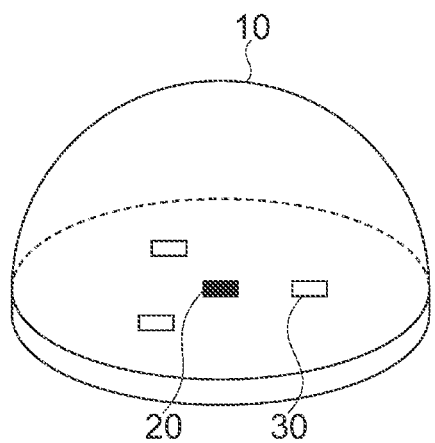
Figure 12E:
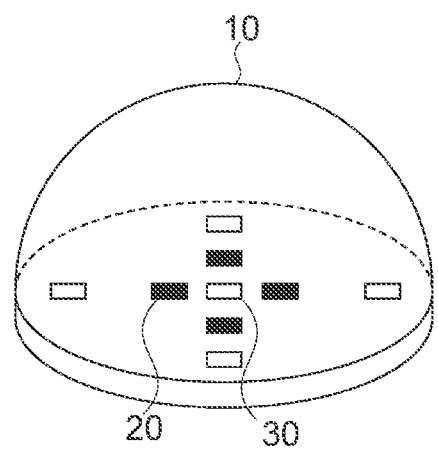

In the example of FIG. 12C, three signal sources 20 and a single sensor 30 are arranged. In the example of FIG. 12D, a single signal source 20 and three sensors 30 are arranged. In the examples of FIGS. 12E, 1A and FIG. 1B, a plurality of signal sources 20 and a plurality of sensors 30 are arranged. As described above, the number of signal sources 20 and the number of sensors 30 are not limited, and there is no limitation on how many signal sources 20 and how many sensors 30 are used in combination. Setting may be performed discretionarily.

A configuration in which the number of sensors 30 is smaller than the number of signal sources 20 makes it possible to reduce the number of circuits necessary for, for example, a signal amplification and an AD conversion that are performed by the sensor 30, and to make a circuit size smaller. Further, it is possible to reduce costs.

A configuration in which the number of signal sources 20 is smaller than the number of sensors 30 makes it possible to obtain a large number of detection results with a single emission of a signal. This makes it possible to perform sensing at a high speed, and to increase a detection frame.

The configuration in which the number of sensors 30 is smaller than the number of signal sources 20 corresponds to a configuration in which the number of at least one signal source is larger than the number of at least one sensor. The configuration in which the number of signal sources 20 is smaller than the number of sensors 30 corresponds to a configuration in which the number of at least one signal source is smaller than the number of at least one sensor.

In the examples of FIGS. 12B, 12C and 12D a distance (an interval) between the signal source 20 and the sensor 30 is constant. On the other hand, in the examples of FIG. 12E and FIGS. 1A and 1B, the distance between the signal source 20 and the sensor 30 is not constant.

For example, when the distance between the signal source 20 and the sensor 30 is large, the sensitivity of sensing is high at a large distance from the deformation member 10. On the other hand, when the distance between the signal source 20 and the sensor 30 is small, the range in which sensing can be performed becomes wide. In other words, the sensor 30 can be a counterpart of the signal source 20 when they are at a small distance from the deformation member 10.

It is sufficient if the arrangement of the signal source 20 and the sensor 30 is set as appropriate on the basis of such findings. For example, setting is performed such that the distance between the signal source 20 and the sensor 30 is not constant. In other words, the signal source 20 and the sensor 30 are arranged such that there are at least two different distances between the signal source 20 and the sensor 30. This makes it possible to perform sensing using a wide range of lenses with respect to, for example, the distance from the deformation member 10.

Note that the configuration in which a distance between the signal source 20 and the sensor 30 is not constant can be provided by at least one of a condition in which "at least one signal source includes a plurality of signal sources" or a condition in which "at least one sensor includes a plurality of sensors" being satisfied.

[Variations of Emission and Detection of Signal]

Figure 13:
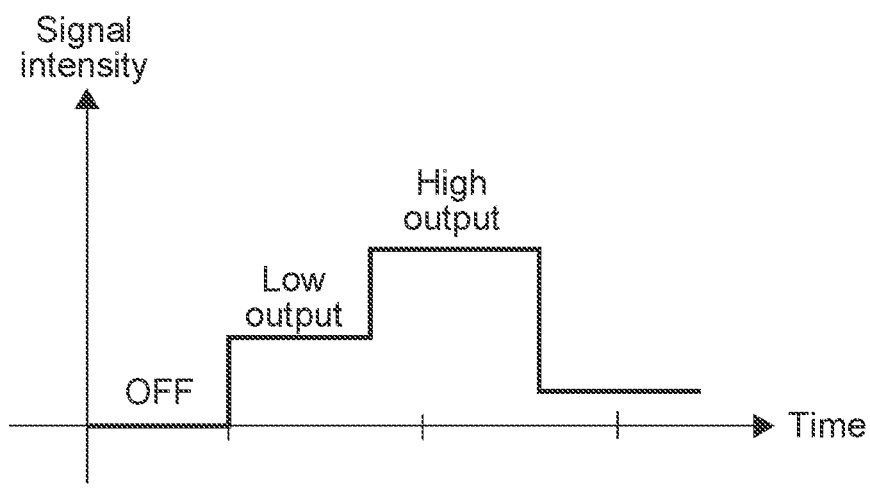
FIG. 13 is a schematic diagram used to describe variations of the emission and the detection of a signal.

As illustrated in FIG. 13, the intensity of a signal emitted by the signal source 20 may be temporally variable. Examples of the intensity of a signal include the intensity of light, the intensity of a radio wave, and the intensity of a sound wave. Further, the intensity of a signal may be defined by, for example, an amount of light or a volume of sound. The case in which the amount of light or the amount of sound is large corresponds to the case in which the intensity is high.

When the intensity of an emitted signal is variable, this makes it possible to perform adjustment such that output is suitable for a dynamic range and can be detected by the sensor 30, and to improve the sensitivity of sensing.

For example, the intensity of a reflected component that returns to the sensor 30 is high when the deformation member 10 is at a small distance. Thus, the intensity of an emitted signal is made lower. The intensity of a reflected component that returns to the sensor 30 is low when the deformation member 10 is at a large distance. Thus, the intensity of an emitted signal is made higher. Accordingly, the sensitivity of sensing can be improved.

A pattern of the variation of the signal intensity is not limited, and may be set discretionarily.

Figure 14A:
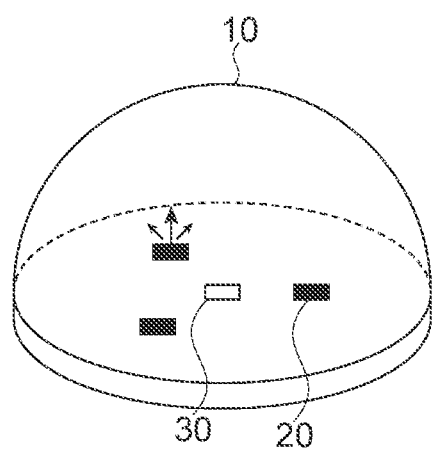
FIGS. 14A, 14B and 14C are schematic diagram used to describe the variations of the emission and the detection of a signal.
Figure 14B:
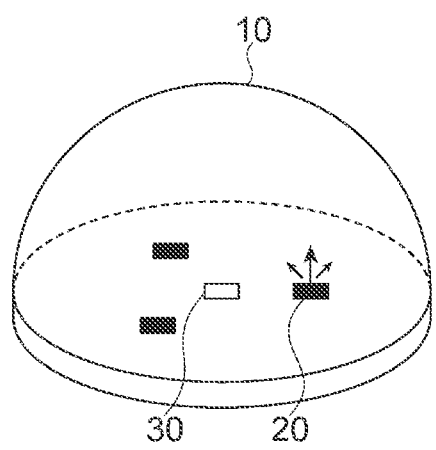
Figure 14C:
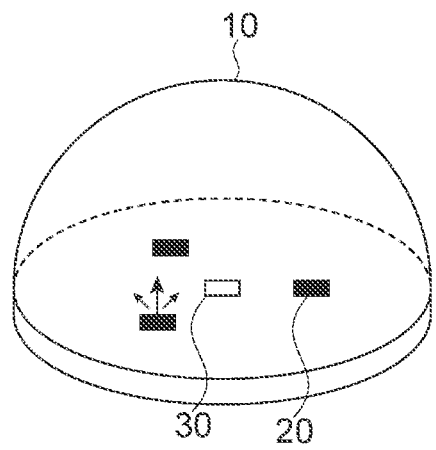

It is assumed that a plurality of signal sources (light emitters) 20 each emitting light as a signal is arranged, as illustrated in FIGS. 14A, 14B and 14C. In this case, the light-emission property may differ depending on the signal source 20 included in the plurality of signal sources 20.

Examples of the emission property include a wavelength of light, an intensity of light, and a light-emission pattern. For example, at least one of these properties differs depending on the signal source 20 included in the plurality of signal sources 20. Note that the emission pattern is typically a temporal pattern regarding a chronological emission of light such as switching between ON and OFF or a control of the intensity of light.

For example, pieces of light of different wavelengths such as red light, green light, and blue light are respectively emitted by three signal sources 20. Of course, a specific setting of a wavelength is not limited.

Further, pieces of light of different intensities are respectively emitted by three signal sources 20.

Furthermore, pieces of light are respectively emitted by three signal sources 20 at different timings. For example, pieces of light are sequentially emitted one by one, as illustrated in FIGS. 14A, 14B and 14C. Of course, without being limited thereto, any emission pattern may be set.

Of course, a wavelength of light, the intensity of light, and a light-emission pattern may be combined as appropriate, and the combined properties may differ depending on the signal source 20 included in the plurality of signal sources 20.

When the emission property differs depending on the signal source 20 included in a plurality of signal sources 20, this makes it possible to increase an amount of information detected by the sensor 30, and to generate accurate deformation-related information. Further, a time-division control of a light emission performed by the signal source 20 makes it possible to reduce power consumption.

Note that, when a radio wave or sound is emitted as a signal, a similar effect can be provided by the emission property differing depending on the signal source 20.

Figure 15:
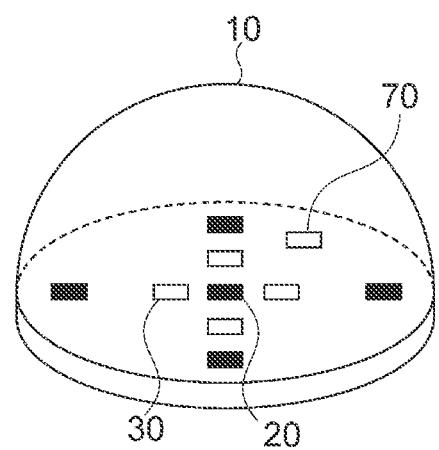
FIG. 15 is a schematic diagram used to describe the coexistence and cooperation between a configuration according to the present technology and a mechanism for another application.

FIG. 15 is a schematic diagram used to describe the coexistence and cooperation between a configuration according to the present technology and a mechanism for another application.

When the wavelength, the frequency, and the like of a signal used to generate deformation-related information are defined as appropriate, this enables the present technology to coexist with, for example, a mechanism for another application using the same type of signal.

For example, in the example of FIG. 15, five signal sources 20 and four sensors 30 are arranged as in the case of the configuration illustrated in FIGS. 1A and 1B.

LEDs that each emit invisible light such as ultraviolet light or infrared light are arranged as the five signal sources 20. Further, light-receiving sensors that are each capable of detecting invisible light are arranged as the four sensors 30. The invisible light is light of which a wavelength (typically a peak wavelength) is not included in a wavelength band of visible light.

This makes it possible to arrange, for example, an LED that emits visible light as a signal source 70 for another application. Consequently, the present technology can be implemented in cooperation with visual content that is provided by lighting or an image display being performed using visible light. For example, lighting or an image display can also be controlled according to an operation performed on the deformation member 10.

As described above, it is possible to avoid interference between a signal used to generate deformation-related information and a signal used by, for example, a mechanism for another application, and to improve the value of the UI apparatus 100.

Likewise, for example, the signal source 20 emitting, as a signal used to generate deformation-related information, a radio wave of which the wavelength is 1 mm or more, and the sensor 30 detecting a radio wave of which the wavelength is 1 mm or more are arranged when a radio wave is emitted as a signal.

This makes it possible to, for example, use the present technology in combination with, for example, a communication mechanism that performs communication using a radio wave of which the wavelength is 1 mm or less.

When the wavelength and the frequency of a radio wave emitted as a signal used to generate deformation-related information are defined as appropriate, this makes it possible to, for example, use the present technology in combination with, or in corporation with wireless LAN communication such as Wi-Fi or near field communication such as Bluetooth (registered trademark).

Likewise, for example, the signal source 20 emitting, as a signal used to generate deformation-related information, an ultrasonic wave of which the frequency is 20 kHz or more, and the sensor 30 detecting a radio wave of which the wavelength is 1 mm or more are arranged when sound is emitted as a signal.

This makes it possible to, for example, use the present technology in combination with, for example, a speaker mechanism that outputs sound of which the frequency is 20 kHz or less. It is possible to, for example, use the present technology in combination with, or in corporation with a mechanism that reproduces sound content.

Figure 16A:
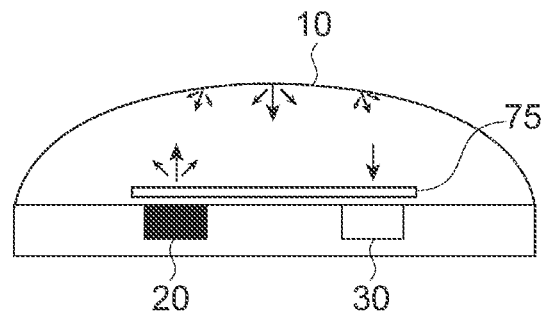
FIGS. 16A and 16B are schematic diagrams used to describe a filter portion.
Figure 16B:
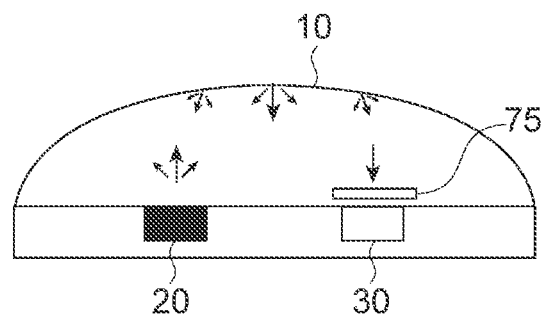

FIGS. 16A and 16B are schematic diagrams used to describe a filter portion. In FIGS. 16A and 16B, light is emitted by the signal source 20 serving as a signal emitter. The sensor 30 serving as a detector can detect the emitted light.

A filter portion 75 is an optical filter of which the light transmittance is controlled according to the wavelength band. Examples of the optical filter include optical filters having various configurations, such as an optical filter through which only light of a specified wavelength is transmitted, and an optical filter of which the light transmittance is continuously changed for each wavelength band.

As illustrated in FIG. 16A, the filter portion 75 is arranged over both the signal source 20 and the sensor 30. This makes it possible to define, as appropriate, a wavelength of light emitted by the signal source 20 toward the deformation member 10. Further, this makes it possible to define a wavelength of light detected by the sensor 30.

As illustrated in FIG. 16B, the filter portion 75 may be arranged only over the sensor 30. In this case, it is also possible to define a wavelength of light detected by the sensor 30.

For example, invisible light such as ultraviolet light or infrared light is emitted as a signal. An optical filter through which invisible light is transmitted and that blocks visible light is arranged as the filter portion 75. This makes it possible to remove a noise component such as visible light that enters from an external space, and thus to improve the sensitivity of sensing.

Note that the filter portion 75 also makes it possible to improve the sensitivity of sensing when a radio wave or sound is emitted as a signal.

Figure 17:
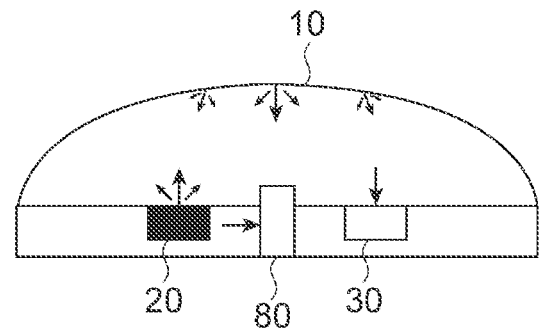
FIG. 17 is a schematic diagram used to describe a blocking portion.

FIG. 17 is a schematic diagram used to describe a blocking portion.

In FIG. 17, the signal source 20 serving as a signal emitter is arranged to be capable of emitting a signal toward the deformation member 10. The sensor 30 serving as a detector is arranged to be capable of detecting a signal reflected off the deformation member 10.

A blocking portion 80 is arranged between the signal source 20 and the sensor 30, and blocks a signal that travels toward the sensor 30 without being reflected off the deformation member 10.

A specific configuration of the blocking portion 80 is not limited, and any configuration may be adopted according to the type of signal.

The arrangement of the blocking portion 80 makes it possible to suppress a noise component that is not a signal corresponding to the deformation of the deformation member 10, and thus to improve the sensitivity of sensing.

[Example of Configuration of Inner Surface]

An example of a configuration of the inner surface 10a of the deformation member 10 is described.

It is assumed that light is emitted as a signal used to generate deformation-related information. In other words, the signal source 20 emitting light is arranged as a signal emitter. Further, the sensor 30 being capable of detecting light is arranged as a detector.

A diffusely reflective configuration that causes light to be diffusely reflected is provided to the inner surface 10a being included in the deformation member 10 and off which light can be reflected. For example, the diffusely reflective configuration can be provided, for example, by microroughness being provided to the inner surface 10a or by coating processing being performed on the inner surface 10a. Of course, any other configuration may be adopted.

The provision of the diffusely reflective configuration enables light to be reflected such that a large amount of diffusely reflected component is included. This results in a strong correlation between a change in a distance between the sensor 30 and the inner surface 10a that is caused according to the deformation of the inner surface 10a, and a result of detection performed by the sensor 30. Thus, deformation-related information regarding a distance between the sensor 30 and the inner surface 10a, that is, an amount of pressing performed with the object 2 can be generated with a high degree of accuracy.

On the other hand, a specularly reflective configuration that causes light to be specularly reflected is provided to the inner surface 10a being included in the deformation member 10 and off which light can be reflected. For example, the specularly reflective configuration can be provided by, for example, coating processing being performed on the inner surface 10a. Of course, any other configuration may be adopted.

The provision of the specularly reflective configuration enables light to be reflected such that a large amount of specularly reflected component is included. This results in a strong correlation between an angle (a direction) of a reflection of a signal depending on the deformation of the inner surface 10a, and the intensity level corresponding to a sensor value. Thus, deformation-related information regarding an inclination (an angle) of the inner surface 10a can be generated with a high degree of accuracy.

Note that a method that includes providing the diffusely reflective configuration and the specularly reflective configuration and measuring the height and the inclination on the basis of a sensor value is a particularly effective method when the reflected-light-amount-type sensor 30 being capable of detecting an amount of reflected light is used.

Of course, the type of sensor with which the present technology can be implemented is not limited. It is sufficient if an optimal type of sensor is used according to a method for generating deformation-related information. The present technology can be implemented using a reflected-light-amount-type sensor; or a so-called time-of-flight (ToF) sensor that uses, for example, a timing of the arrival of a reflected signal, and phase information; or any other type of sensor.

As described above, in the UI apparatus 100 according to the present embodiment, the deformation member 10 can be deformed by controlling the flow of air with respect to the internal space S1. Further, deformation-related information regarding the deformation of the deformation member 10 can be generated on the basis of a result of detection performed by the sensor 30 arranged out of contact with the deformation member 10.

A tactile sense can be provided with a high degree of accuracy by fluid being controlled, on the basis of deformation-related information. Specifically, the UI apparatus 100 according to the present embodiment is suitable for, for example, a button of a UI apparatus in which tactile-sense feedback is provided by an operation being performed, a gamepad, and a mouse for a PC.

Further, an operation or the like that is input to the deformation member 10 can be detected with a high degree of accuracy on the basis of deformation-related information. Specifically, the UI apparatus 100 according to the present embodiment can be applied to measurement of the skill involving contact with, for example, a piano or a keyboard, and measurement related to the body due to the application to the surface of, for example, a sofa or a pillow. Further, the shape changeable apparatus can also be applied to an apparatus just intended to change the shape of a video projection plane or an object such as a figurine.

There has been an increasing demand for a deformation interface of which a surface is deformable when the surface is touched. Since the surface is deformable when being touched, it is possible to provide, for example, an experience of a realistic tactile sense, a soft feeling of conforming to the skin, input/output independent of the visual and auditory senses, more natural and intuitive input/output, and pleasant input/output.

For example, a pressure sensor that detects the pressure of fluid is arranged in a configuration in which fluid is sealed with a deformation surface. Information obtained as a result of detection performed by the pressure sensor is limited to a one-dimensional change. Thus, it is difficult to detect high-level information such as information including, for example, an inclination of deformation, unevenness, and a position of contact with an object.

Further, in the case of tactile-sense feedback based on a result of detection performed by the pressure sensor, a provided tactile sense (a touch felt by a user) varies depending on how to touch.

Further, in the case of an electrostatic contact detecting technology, a sensing surface includes, for example, an electrode plate, and this prevents a large deformation such as elongation and contraction, and expansion. Further, a problem with the durability of a sensor may also be caused.

It has further turned out, in the process of discussing the present technology, that, in the case of conventional technologies, it is difficult to achieve both a large deformation of a deformation surface by controlling the flow of fluid, and sensing performed to obtain high-level information such as a contact position and a direction, as described above.

The shape changeable apparatus and the shape control method according to the present technology makes it possible to greatly deform the deformation member 10 with a high degree of accuracy by controlling the flow of fluid (air).

Further, it is possible to generate high-level deformation-related information that includes, for example, an inclination of a shape, unevenness, and a position of contact with an object by the contactless sensor 30 detecting a signal reflected off the inner surface 10a of the deformation member 10. Note that the arrangement of the contactless sensor 30 does not prevent the member from being greatly deformed.

As described above, the present technology makes it possible to achieve both a large deformation of a deformation surface with a high degree of freedom and sensing performed to obtain high-level information.

As described above, the following effects can be provided by the present technology.

Sensing performed to obtain high-level information can be easily achieved by arranging a plurality of signal sources 20 and a plurality of sensors 30 at spatially different positions as appropriate.

The shape of a deformation surface and a contact state of an object in contact with the deformation surface can be estimated with a high degree of accuracy by integratively analyzing information obtained from a built-in sensor out of contact with the deformation surface. For example, the shape of a deformation surface is estimated by integratively analyzing a sensor-value bias and a total of sensor values, and information regarding, for example, the presence or absence of contact with an object such as a finger, the number of objects, a position of an object, a movement of (tracing performed with) an object, and the size of an object can be acquired from the estimated shape.

A soft and fine deformation that is unique to fluid makes it possible to achieve a high level of intuitive UI input.

The accuracy in sensing performed by the sensor 30 can be improved.

The quality in tactile-sense provision can be improved.

Different touches can be provided according to a touch direction and a touch speed.

Variations in touch due to variations in touch position and variations in touch speed can be suppressed, and this makes it possible to accurately provide a tactile sense more stably. For example, it is possible to prevent variations in a result of sensing performed to obtain an amount of pressing from being caused between a person who presses the center of the outer surface 10*b* of the deformation member 10 and a person who presses an external side of the outer surface 10*b* of the deformation member 10.

OTHER EMBODIMENTS

The present technology is not limited to the embodiments described above, and may achieve other various embodiments.

Figure 18:
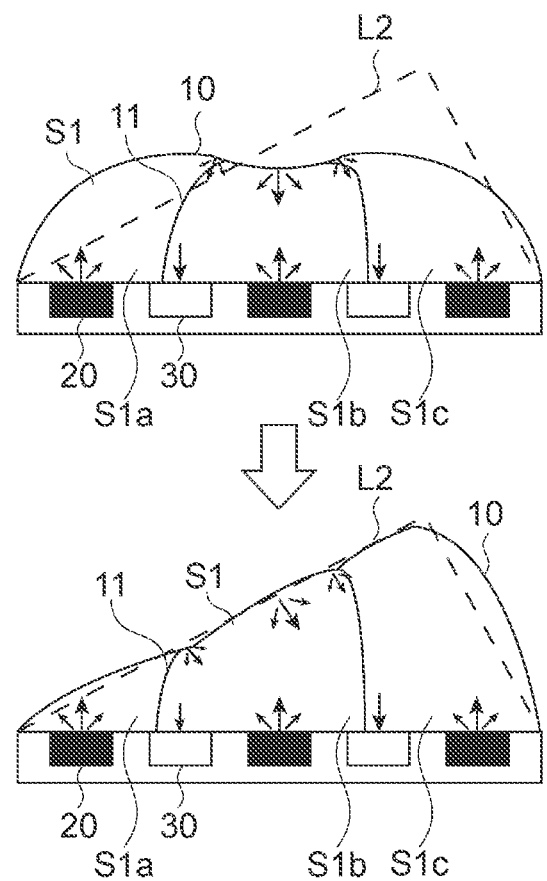
FIG. 18 schematically illustrates another example of a configuration of the deformation member.

FIG. 18 schematically illustrates another example of the configuration of the deformation member.

The deformation member 10 illustrated in FIG. 18 includes a plurality of partitions 11. The internal space S1 is divided into a plurality of partial spaces S1*a* to S1*c* by the plurality of partitions 11.

The fluid control mechanism can individually control the flow of fluid with respect to each of the plurality of partial spaces S1*a* to S1*c*. Thus, the shape of the entirety of the deformation member 10 can be finely controlled by individually controlling the shape and the like of each of the partial spaces S1*a* to S1*c*.

For example, deformation-related information regarding a shape of the deformation member 10 can be generated with a high degree of accuracy on the basis of a result of detection performed by the sensor 30, and the shape and the like of each of the partial spaces S1*a* to S1*c* can be controlled with a high degree of accuracy.

For example, a current shape based on deformation-related information is compared to data of a target shape, as schematically indicated by a dashed line L2. Then, fluid is controlled on the basis of a result of the comparison, and this makes it possible to easily deform the deformation member 10 into the target shape.

The example in which the shape changeable apparatus and the shape control method according to the present technology are applied to an input apparatus and a tactile sense providing apparatus has been described above. Without being limited thereto, the shape changeable apparatus and the shape control method according to the present technology can also be applied to, for example, an amusement apparatus of which a deformation member is deformed into a specified shape of, for example, a character or an animal to provide enjoyment to a user. The shape can be controlled with a high degree of accuracy on the basis of deformation-related information.

Figure 19:
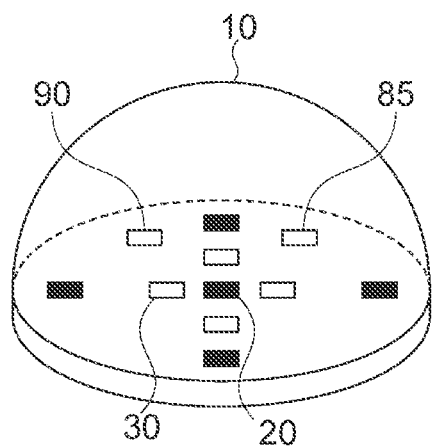
FIG. 19 is a schematic diagram used to describe the use in combination with, and the cooperation with other types of tactile-sense provision.

FIG. 19 is a schematic diagram used to describe the use in combination with, and the cooperation with other types of tactile-sense provision.

For example, a pressure sensor 85 and a temperature sensor 90 are arranged, as illustrated in FIG. 19. Further, a tactile sense providing mechanism (of which an illustration is omitted) that can control a degree of hardness of the deformation member 10 and a temperature of the deformation member 10 is provided.

The degree of hardness of the deformation member 10 can be controlled by, for example, controlling the pressure of fluid. The deformation member 10 can be made harder by increasing the pressure of fluid. The deformation member 10 can be made softer by reducing the pressure of fluid.

Further, the degree of hardness of the deformation member 10 can be controlled by controlling the tension on the deformation member 10 in the form of a film. For example, the deformation member 10 can be made harder by pulling the deformation member 10. The deformation member 10 can be made softer by relaxing the deformation member 10. Of course, the control is not limited thereto.

The temperature of the deformation member 10 can be controlled by, for example, controlling the temperature of fluid. The deformation member 10 can be made warmer by increasing the temperature of fluid. The deformation member 10 can be made cooler by decreasing the temperature of fluid. Further, the temperature can also be adjusted by causing fluid that is kept at a specified temperature to flow into the internal space S1. Of course, the control is not limited thereto.

Note that the degree of hardness and the temperature of the deformation member may be controlled on the basis of deformation-related information generated on the basis of a result of detection performed by the sensor 30. A configuration in which at least one of a degree of hardness of the deformation member or a temperature of the deformation member can be controlled, can also be achieved.

The pressure sensor 85, the temperature sensor 90, and the tactile sense providing mechanism that can control a degree of hardness of the deformation member and a temperature of the deformation member serve as a tactile sense providing section that can control at least one of the degree of hardness or the temperature, such that a specified tactile sense is provided to a user in contact with the member.

Figure 23:
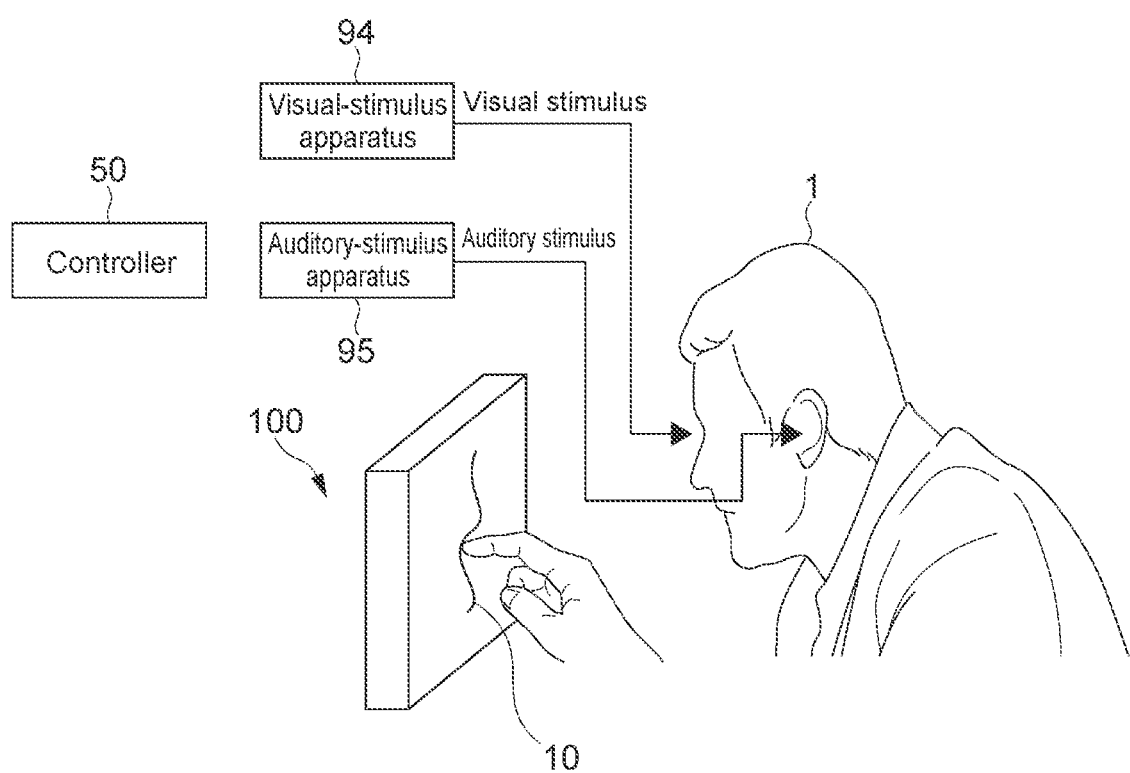
FIG. 23 schematically illustrates an example of a configuration of a shape changeable system for use in combination with, and cooperation with a sensory stimulus other than a tactual stimulus.

FIG. 23 schematically illustrates an example of a configuration of a shape changeable system for use in combination with, and cooperation with a sensory stimulus other than a tactual stimulus.

Figure 24:
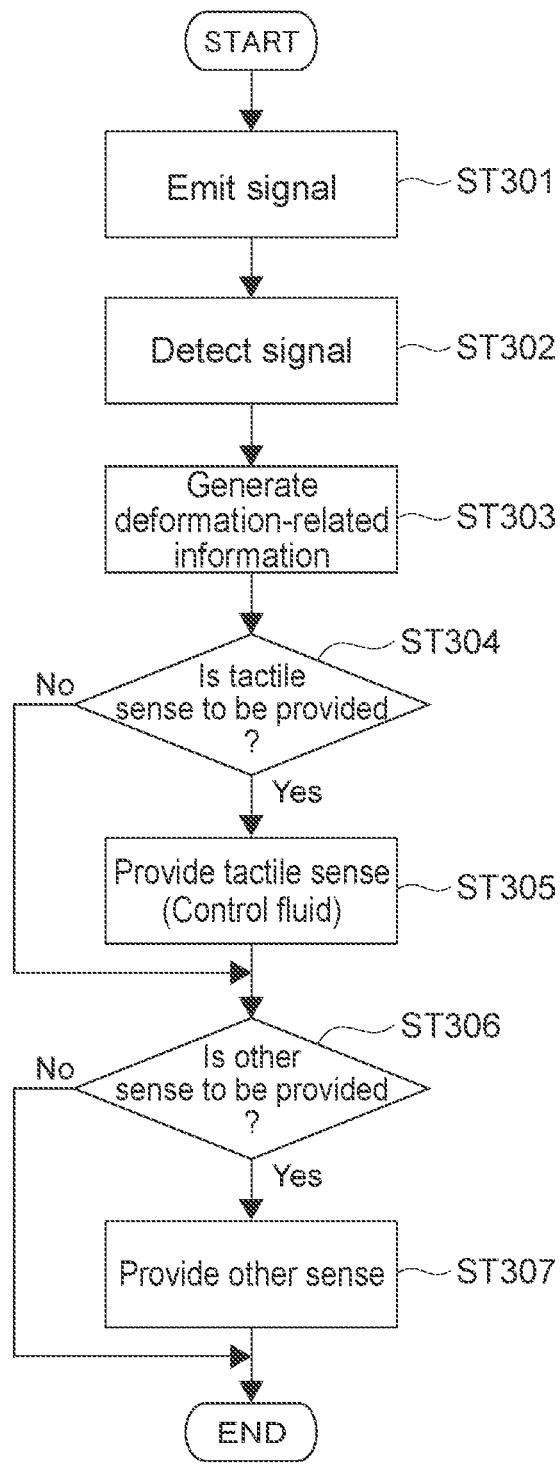
FIG. 24 is a flowchart illustrating an example of processing of use in combination with, and cooperation with other sensory stimuli.

FIG. 24 is a flowchart illustrating an example of processing of use in combination with, and cooperation with other sensory stimuli.

For example, a shape changeable apparatus 100, a visual-stimulus apparatus 94, and an auditory-stimulus apparatus 95 are arranged, as illustrated in FIG. 23. Note that the controller 50 can control operations of the respective devices.

Examples of the visual-stimulus apparatus 94 includes a projector that projects a video, an installation-type display, and a wearable display.

A location at which a visual stimulus is generated by the visual-stimulus apparatus 94 may be the same as the deformation member 10. In other words, the visual-stimulus apparatus 94 may be situated on the deformation member 10. Of course, without being limited thereto, the visual-stimulus apparatus 94 may be placed just under the deformation member 10 or may be installed at a distant location.

Examples of the auditory-stimulus apparatus 95 include an installation-type speaker, a wearable earphone, and a wearable headphone.

Steps 301 to 305 illustrated in FIG. 24 are similar to Steps 101 to 105 illustrated in FIG. 2.

It is determined, by the controller 50, whether another sense is to be provided, on the basis of deformation-related information (Step 306).

When it has been determined that the other sense is to be provided (Yes in Step 306), the other sense is provided (Step 307).

For example, a video can be generated by the visual-stimulus apparatus 94 on the basis of deformation-related information generated from a result of detection performed by the sensor.

For example, the deformation of the deformation member 10 is reflected in the deformation of an object in the video on the basis of the deformation-related information. Further, a posture of a hand or a finger of the user 1 is estimated on the basis of the deformation-related information, and reflected in display of the hand or the finger in the video.

The present technology can also be applied to such a UI using a video. Note that deformation-related information can be reflected in a video such that the deformation looks like being larger or, conversely, smaller than it actually is. Of course, without being limited thereto, any processing may be performed.

Further, when a location at which a visual stimulus is generated by the visual-stimulus apparatus 94 is the same as the deformation member 10, the deformation member 10 can be deformed in conjunction with a video or an image.

Likewise, sound can be generated by the auditory-stimulus apparatus 95 on the basis of deformation-related information generated from a result of detection performed by the sensor.

For example, on the basis of deformation-related information, the volume, the frequency, the tone, and the like of sound can be adjusted, and predetermined sound data can be reproduced. The present technology can also be applied to such a UI using sound including a voice and music.

Both the visual-stimulus apparatus 94 and the auditory-stimulus apparatus 95 may exist at the same time, or only one of them may exist. Further, the application is not limited to the description above, and cooperation with other senses such as the somatic sensation and the sense of smell is also possible. In other words, the present technology can also be used in combination with, and cooperation with a sensory-stimulus apparatus used to stimulate a sense other than a sense of sight and a sense of hearing.

Such an application of the present technology makes it possible to provide a shape changeable system that can control at least one sensory-stimulus apparatus on the basis of deformation-related information to provide a specified sense to the user 1.

Figure 20:
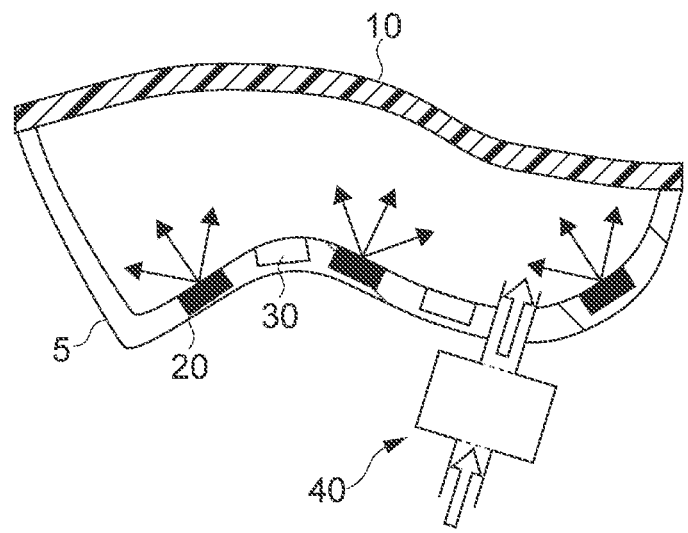
FIG. 20 schematically illustrates another example of a configuration of a shape changeable apparatus according to the present technology.

FIG. 20 schematically illustrates another example of a configuration of the shape changeable apparatus according to the present technology.

As illustrated in FIG. 20, the shape of the base 5 in which the signal source 20 and the sensor 30 are arranged is not limited, and the base 5 may be designed discretionarily. The base 5 including a curved surface on the internal space S1 is arranged, and the signal source 20 and the sensor 30 are arranged in the curved surface. The emission direction in which the signal source 20 emits a signal, the orientation of the sensor 30, and the like are not limited, and may be individually set discretionarily.

Likewise, the configuration of the deformation member 10 and the configuration of the fluid control mechanism 40 are not limited, and the deformation member 10 and the fluid control mechanism 40 may be designed discretionarily.

The example in which the signal source 20 is arranged within the internal space S1 has been described above. Without being limited thereto, the signal source 20 may be arranged outside of the internal space S1 as long as it is possible to emit a signal into the internal space S1.

For example, a signal blocking region is formed in a portion of the deformation member 10 in a specified pattern. A region other than the signal blocking region is a signal transmissive region.

The sensor 30 detects a signal that is transmitted through the signal transmissive region. Deformation-related information can be generated on the basis of a result of the detection performed by the sensor 30. Further, deformation-related information regarding a contact state of the object 2 can also be generated by emitting a signal that is to be blocked by the object 2.

The deformation member 10 is not limited to being in the form of a film, and any form can be adopted.

Figure 25:
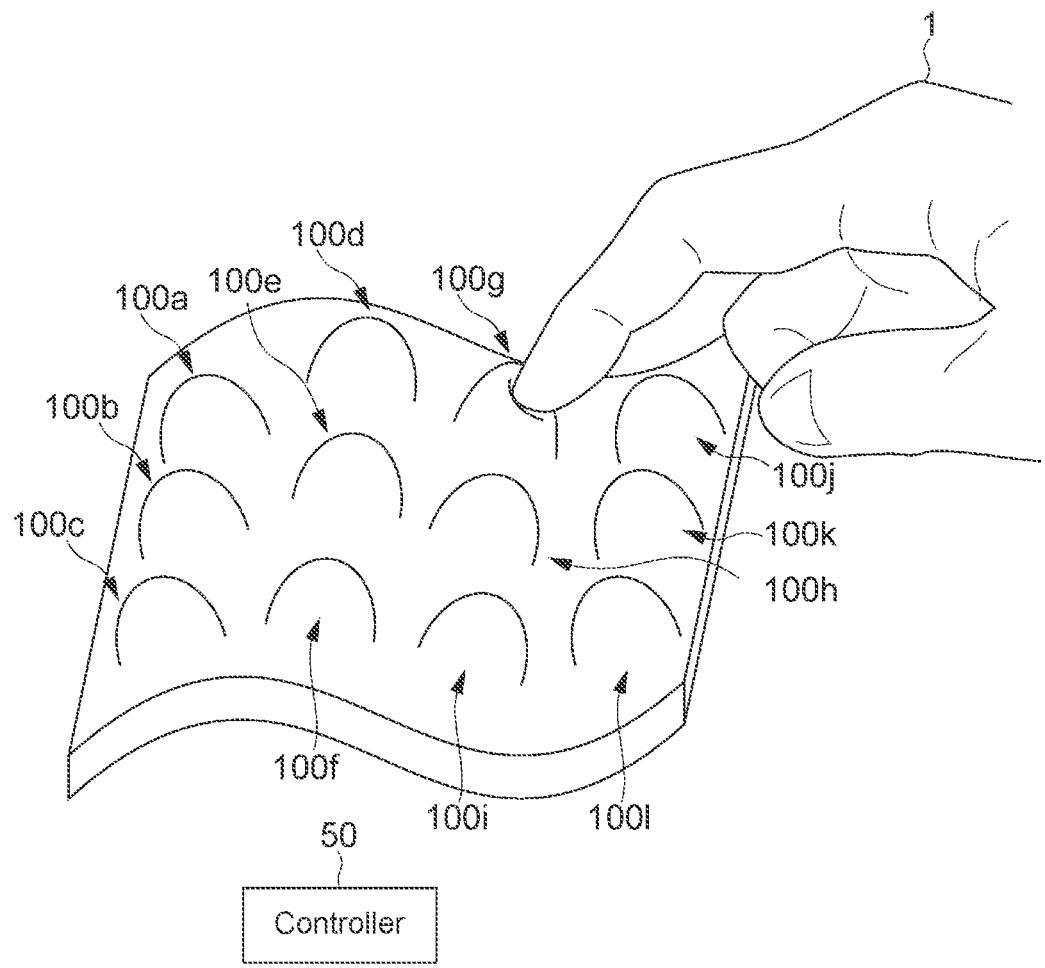
FIG. 25 schematically illustrates an example of a configuration in which a plurality of shape changeable apparatuses according to the present technology is used.

FIG. 25 schematically illustrates an example of a configuration in which a plurality of shape changeable apparatuses according to the present technology is used.

As illustrated in FIG. 25, a large number of shape changeable apparatuses 100 can be arranged linearly or in an array on a flat or curved surface. In the example illustrated in FIG. 25, twelve shape changeable apparatuses 100 that are shape changeable apparatuses 100a to 1001 are arranged.

For example, on the basis of sensing results output by the plurality of shape changeable apparatuses 100, at least one piece of deformation-related information may be integrated by the controller 50. The integrated at least one piece of information may be used as input for a UI of another system. Further, according to the input, a tactile sense may be provided to the user 1 in the form of at least one deformation, or the at least one deformation may be reflected in a sensory stimulus other than a tactual stimulus.

Further, for example, the deformation of a certain shape changeable apparatus 100 may be reflected in the deformation of an adjacent shape changeable apparatus on the basis of deformation-related information. In other words, it is also possible to construct a system in which the deformations of the deformation members of the respective shape changeable apparatuses 100 are reflected in each other.

In the embodiment illustrated in FIGS. 1A and 1B, the "generator", which is a functional block, is implemented by the CPU of the controller 50 executing a specified program. The "generator" may include a function of performing, for example, preprocessing and codec processing regarding a generation of deformation-related information, such as denoising and compression. Of course, a block that performs, for example, such preprocessing may be implemented as a functional block that is different from the generator.

The shape control method according to the present technology may be performed and the shape changeable apparatus according to the present technology may be implemented by a computer included in the shape changeable apparatus and another computer working cooperatively, the other computer being capable of communicating with the computer through, for example, a network.

For example, a portion or the entirety of the "generator" may be included in the other computer being capable of communicating with the computer through, for example, a network. In this case, the "generator" may include a communication function. Of course, another functional block that includes a communication function may be implemented, and may be capable of working cooperatively with a "communication section".

For example, a result of detection performed by the detector of the shape changeable apparatus is transmitted to the other computer being capable of communicating with the computer through, for example, a network. On the basis of the detection result, deformation-related information is generated by the "generator" implemented in the other computer. The generated deformation-related information, information generated on the basis of the deformation-related information, or the like is transmitted to the shape changeable apparatus through, for example, a network.

The "shape control method" according to the present technology may be performed in such a configuration. Further, such a configuration may be called a "shape changeable system" according to the present technology. Of course, the same applies to a component other than the "generator".

In other words, the shape control method and the program according to the present technology can be executed not only in a computer system that includes a single computer, but also in a computer system in which a plurality of computers operates cooperatively. Note that, in the present disclosure, the system refers to a set of components (such as apparatuses and modules (parts)) and it does not matter whether all of the components are in a single housing. Thus, both a plurality of apparatuses accommodated in separate housings and connected to each other through a network, and a single apparatus in which a plurality of modules is accommodated in a single housing correspond to the system.

For example, the generation of deformation-related information, the control of the signal source and the sensor, the control of the fluid control mechanism, and the like described above may be executed by a single computer, or the respective processes may be executed by different computers. Further, the execution of each process by a specified computer includes causing another computer to execute a portion of or all of the process and acquiring a result of it.

In other words, the shape control method and the program according to the present technology can also be applied to a configuration of cloud computing in which a single function is shared and cooperatively processed by a plurality of apparatuses through a network.

The arrangement of the UI apparatus, the shape changeable apparatus, the signal source, and the sensor; the respective configurations of the deformation member and the like; the flow of a signal emission; the flow of a signal detection; the flow of a fluid control; the flow of a generation of deformation-related information; and the like described with reference to the respective figures are merely embodiments, and any modifications may be made thereto without departing from the spirit of the present technology. In other words, for example, any other configurations or algorithms for purpose of practicing the present technology may be adopted.

In the present disclosure, expressions such as "center", "middle", "uniform/constant", "equal", "same/identical", "orthogonal", "parallel", "symmetrical", "extend", "axial direction", "circularly cylindrical", "cylindrical", "ring-shaped", and "annular" respectively include, in concept, expressions such as "substantially the center/substantial center", "substantially the middle/substantially middle", "substantially uniform/substantially constant", "substantially equal", "substantially the same/substantially identical", "substantially orthogonal", "substantially parallel", "substantially symmetrical", "substantially extend", "sub-stantially axial direction", "substantially circularly cylindrical", "substantially cylindrical", "substantially ring-shaped", and "substantially annular".

For example, the expressions such as "center", "middle", "uniform/constant", "equal", "same/identical", "orthogonal", "parallel", "symmetrical", "extend", "axial direction", "circularly cylindrical", "cylindrical", "ring-shaped", and "annular" also respectively include states within specified ranges (such as a range of +/−10%), with expressions such as "exactly the center/exact center", "exactly the middle/exactly middle", "exactly uniform/exactly constant", "exactly equal, "exactly the same/exactly identical", "completely orthogonal", "completely parallel", "completely symmetrical", "completely extend", "fully axial direction", "perfectly circularly cylindrical", "perfectly cylindrical", "perfectly ring-shaped", and "perfectly annular" being respectively used as references.

At least two of the features of the present technology described above can also be combined. In other words, the various features described in the respective embodiments may be combined discretionarily regardless of the embodiments. Further, the various effects described above are not limitative but are merely illustrative, and other effects may be provided.

Note that the present technology may also take the following configurations.

(1) A shape changeable apparatus, including:
  a space forming section that forms a space, and includes a deformable member that is arranged in contact with the space;
  a fluid controller that is capable of deforming the member by controlling a flow of fluid with respect to the space;
  a signal emitter that emits a signal into the space;
  a detector that is arranged out of contact with the member within the space, and detects the emitted signal; and
  a generator that generates information regarding the deformation of the member on the basis of a result of the detection performed by the detector.

(2) The shape changeable apparatus according to (1), in which
  the information regarding the deformation of the member includes at least one of information regarding a shape of the member, or information regarding a contact state of an object in contact with the member.

(3) The shape changeable apparatus according to (1) or (2), in which
  the member is in the form of a film, and includes an inner surface situated on a side of the space, and an outer surface situated on a side of an external space, the inner surface being capable of reflecting the signal, and
  the information regarding the deformation of the member includes at least one of information regarding a shape of the outer surface, or information regarding a contact state of an object in contact with the outer surface.

(4) The shape changeable apparatus according to any one of (1) to (3), in which
  the signal emitter is arranged within the space.

(5) The shape changeable apparatus according to any one of (1) to (4), in which
  the fluid controller controls the flow of the fluid such that, due to the deformation of the member, a specified tactile sense is provided to a user in contact with the member.

(6) The shape changeable apparatus according to (5), in which
the fluid controller controls the flow of the fluid on the basis of the information regarding the deformation of the member.
(7) The shape changeable apparatus according to any one of (1) to (6), in which
the fluid is air.
(8) The shape changeable apparatus according to any one of (1) to (7), in which
the signal emitter emits, as the signal, at least one of light, a radio wave, or sound, and
the detector is capable of detecting at least one of the emitted light, the emitted radio wave, or the emitted sound.
(9) The shape changeable apparatus according to any one of (1) to (8), in which
the signal emitter is capable of temporally changing an intensity of the signal.
(10) The shape changeable apparatus according to any one of (1) to (9), in which
the signal emitter includes at least one signal source that emits the signal,
the detector includes at least one sensor that detects the emitted signal, and
the generator generates the information regarding the deformation of the member on the basis of a result of the detection performed by the at least one sensor.
(11) The shape changeable apparatus according to (10), in which
the number of the at least one signal source is larger than the number of the at least one sensor.
(12) The shape changeable apparatus according to (10), in which
the number of the at least one signal source is smaller than the number of the at least one sensor.
(13) The shape changeable apparatus according to any one of (10) to (12), in which
at least one of a condition in which the at least one signal source includes a plurality of the signal sources, or a condition in which the at least one sensor includes a plurality of the sensors is satisfied, and
the at least one signal source and the at least one sensor are arranged such that a distance between the signal source and the sensor is not constant.
(14) The shape changeable apparatus according to any one of (1) to (13), in which
the generator generates the information regarding the deformation of the member according to a specified learning algorithm.
(15) The shape changeable apparatus according to any one of (1) to (14), in which
the signal emitter is arranged to be capable of emitting the signal toward the member,
the detector is arranged to be capable of detecting the signal reflected off the member, and
the shape changeable apparatus further includes a blocking portion that is arranged between the signal emitter and the detector.
(16) The shape changeable apparatus according to any one of (1) to (15), in which
the signal emitter emits invisible light as the signal.
(17) The shape changeable apparatus according to any one of (1) to (16), in which
the signal emitter emits light as the signal,
the detector is capable of detecting the emitted light, and
the shape changeable apparatus further includes a filter portion that defines a wavelength of the light detected by the detector.
(18) The shape changeable apparatus according to any one of (1) to (17), further including
a tactile sense providing section that is capable of controlling at least one of a degree of hardness of the member or a temperature of the member on the basis of the information regarding the deformation of the member.
(19) A shape control method, including:
deforming a deformable member by controlling a flow of fluid with respect to a space that is formed by a space forming section that includes the deformable member, the space being formed to be brought into contact with the member;
emitting a signal into the space;
detecting the signal by a detector that is arranged out of contact with the member within the space; and
generating information regarding the deformation of the member on the basis of a result of the detection performed by the detector.
(20) A tactile sense providing apparatus, including:
a space forming section that forms a space, and includes a deformable member that is arranged in contact with the space;
a fluid controller that is capable of deforming the member by controlling a flow of fluid with respect to the space;
a signal emitter that emits a signal into the space;
a detector that is arranged out of contact with the member within the space, and detects the emitted signal; and
a generator that generates information regarding the deformation of the member on the basis of a result of the detection performed by the detector, the fluid controller controlling the flow of the fluid such that, due to the deformation of the member, a specified tactile sense is provided to a user in contact with the member.
(21) The shape changeable apparatus according to (2), in which
the information regarding the contact state of the object includes at least one of the presence or absence of the object in contact with the member, a position of the object in contact with the member, the number of the objects in contact with the member, a size of the object in contact with the member, a movement of the object in contact with the member, a shape of the object in contact with the member, or the type of the object in contact with the member.
(22) The shape changeable apparatus according to any one of (1) to (17) or (21), in which
the signal emitter includes a plurality of light emitters each emitting light as the signal, and
an emission property differs depending on the light emitter included in the plurality of light emitters.
(23) The shape changeable apparatus according to (22), in which
the emission property includes at least one of a wavelength of light, an intensity of the light, or a light-emission pattern.
(24) The shape changeable apparatus according to any one of (1) to (18) or (21) to (23), in which
the signal emitter emits light as the signal,
the member includes an internal surface that is situated on a side of the space and is capable of reflecting the light, and
the inner surface has a configuration that causes the light to be diffusely reflected off the inner surface.

(25) The shape changeable apparatus according to any one of (1) to (18) or (21) to (24), in which
the signal emitter emits light as the signal,
the member includes an internal surface that is situated on a side of the space and is capable of reflecting the light, and
the inner surface has a configuration that causes the light to be specularly reflected off the inner surface.
(26) The shape changeable apparatus according to any one of (1) to (18) or (21) to (25), further including
a tactile sense providing section that is capable of controlling at least one of a degree of hardness of the member or a temperature of the member such that a specified tactile sense is provided to a user in contact with the member.
(27) The shape changeable apparatus according to (15), in which
the blocking portion blocks the signal traveling toward the detector without being reflected off the member.
(28) The shape changeable apparatus according to (14), in which
the specified learning algorithm includes a learning algorithm with respect to chronological data.
(29) The shape changeable apparatus according to (28), in which
the learning algorithm with respect to chronological data includes at least one of a recurrent neural network (RNN) or long-short term memory (LSTM).
(27) A shape changeable system, including:
a space forming section that forms a space, and includes a deformable member that is arranged in contact with the space;
a fluid controller that is capable of deforming the member by controlling a flow of fluid with respect to the space;
a signal emitter that emits a signal into the space;
a detector that is arranged out of contact with the member within the space, and detects the emitted signal; and
a generator that generates information regarding the deformation of the member on the basis of a result of the detection performed by the detector.
(28) The shape changeable system according to (27), further including
at least one sensory-stimulus apparatus, the shape changeable system controlling the at least one sensory-stimulus apparatus on the basis of the information regarding the deformation of the member to provide a specified sense to a user.
(29) The shape changeable system according to (28), in which
the at least one sensory-stimulus apparatus includes at least one of a visual-stimulus apparatus, or an auditory-stimulus apparatus.

REFERENCE SIGNS LIST

S1 internal space
1 user
2 object
10 deformation member
10a inner surface
10b outer surface
20 signal source
30 sensor
40 fluid control mechanism
50 controller
70 signal source for another application
75 filter portion
80 blocking portion
85 pressure sensor
90 temperature sensor
100 UI apparatus

The invention claimed is:
1. A shape changeable apparatus, comprising:
a space forming section configured to form a space, wherein the space forming section includes a deformable member that is in contact with the space;
a fluid controller configured to deform the deformable member based on a control of a flow of fluid with respect to the space;
a signal emitter configured to emit a signal into the space;
a detector configured to detect the emitted signal, wherein the detector is within the space and out of contact with the deformable member; and
a generator configured to generate information regarding the deformation of the deformable member based on a result of detection by the detector, wherein the information regarding the deformation of the deformable member is generated based on a specified learning algorithm.
2. The shape changeable apparatus according to claim 1, wherein
the information regarding the deformation of the deformable member includes at least one of information regarding a shape of the deformable member, or information regarding a contact state of an object in contact with the deformable member.
3. The shape changeable apparatus according to claim 1, wherein
the deformable member is in a form of a film,
the deformable member includes an inner surface on a side of the space and an outer surface on a side of an external space,
the inner surface is configured to reflect the signal, and
the information regarding the deformation of the deformable member includes at least one of information regarding a shape of the outer surface, or information regarding a contact state of an object in contact with the outer surface.
4. The shape changeable apparatus according to claim 1, wherein
the signal emitter is within the space.
5. The shape changeable apparatus according to claim 1, wherein
the fluid controller is further configured to control the flow of the fluid to provide a specified tactile sense to a user in contact with the deformable member, and
the specified tactile sense is provided based on the deformation of the deformable member.
6. The shape changeable apparatus according to claim 5, wherein
the fluid controller is further configured to control the flow of the fluid based on the information regarding the deformation of the deformable member.
7. The shape changeable apparatus according to claim 1, wherein the fluid is air.
8. The shape changeable apparatus according to claim 1, wherein
the signal emitter is further configured to emit, as the signal, at least one of light, a radio wave, or sound, and
the detector is further configured to detect at least one of the emitted light, the emitted radio wave, or the emitted sound.

9. The shape changeable apparatus according to claim 1, wherein
the signal emitter is further configured to temporally change an intensity of the signal.

10. The shape changeable apparatus according to claim 1, wherein
the signal emitter includes at least one signal source configured to emit the signal,
the detector includes at least one sensor configured to detect the emitted signal, and
the generator is further configured to generate the information regarding the deformation of the deformable member based on a basis of a result of detection performed by the at least one sensor.

11. The shape changeable apparatus according to claim 10, wherein a number of the at least one signal source is larger than a number of the at least one sensor.

12. The shape changeable apparatus according to claim 10, wherein a number of the at least one signal source is smaller than a number of the at least one sensor.

13. The shape changeable apparatus according to claim 10, wherein
at least one of a condition in which the at least one signal source includes a plurality of the signal sources, or a condition in which the at least one sensor includes a plurality of the sensors is satisfied, and
a distance between the at least one signal source and the at least one sensor is not constant.

14. The shape changeable apparatus according to claim 1, wherein
the signal emitter is further configured to emit the signal toward the deformable member,
the detector is further configured to detect the signal reflected off the deformable member, and
the shape changeable apparatus further comprises a blocking portion between the signal emitter and the detector.

15. The shape changeable apparatus according to claim 1, wherein the signal emitter is further configured to emit invisible light as the signal.

16. The shape changeable apparatus according to claim 1, wherein
the signal emitter is further configured to emit light as the signal,
the detector is further configured to detect the emitted light, and
the shape changeable apparatus further comprises a filter portion configured to define a wavelength of the light detected by the detector.

17. The shape changeable apparatus according to claim 1, further comprising:
a tactile sense providing section configured to control at least one of a degree of hardness of the deformable member or a temperature of the deformable member based on the information regarding the deformation of the deformable member.

18. A shape control method, comprising:
deforming a deformable member by controlling a flow of fluid with respect to a space, wherein
a space forming section is configured to form the space,
the space forming section includes the deformable member, and
the space is in contact with the deformable member;
emitting a signal into the space;
detecting the signal by a detector, wherein the detector is within the space and out of contact with the deformable member; and
generating information regarding the deformation of the deformable member based on a result of detection by the detector, wherein the information regarding the deformation of the deformable member is generated based on a specified learning algorithm.

19. A tactile sense providing apparatus, comprising:
a space forming section configured to form a space, wherein the space forming section includes a deformable member that is in contact with the space;
a fluid controller configured to of deform the deformable member based on a control of a flow of fluid with respect to the space, wherein a specified tactile sense is provided to a user in contact with the deformable member based on the deformation of the deformable member;
a signal emitter configured to emit a signal into the space;
a detector configured to detect the emitted signal, wherein the detector is within the space and out of contact with the deformable member; and
a generator configured to generate information regarding the deformation of the deformable member based on a basis of a result of detection performed by the detector, wherein the information regarding the deformation of the deformable member is generated based on a specified learning algorithm.

20. A shape changeable apparatus, comprising:
a space forming section configured to form a space, wherein the space forming section includes a deformable member that is in contact with the space;
a fluid controller configured to of deform the deformable member based on a control of a flow of fluid with respect to the space;
a signal emitter configured to emit a signal into the space and temporally change an intensity of the signal;
a detector configured to detect the emitted signal, wherein the detector is within the space and out of contact with the deformable member; and
a generator configured to generate information regarding the deformation of the deformable member based on a result of detection by the detector, wherein the information regarding the deformation of the deformable member is generated based on a specified learning algorithm.

* * * * *